(12) United States Patent
Kishida et al.

(10) Patent No.: US 8,993,383 B2
(45) Date of Patent: Mar. 31, 2015

(54) THIN-FILM TRANSISTOR AND METHOD FOR MANUFACTURING THIN-FILM TRANSISTOR

(71) Applicant: Panasonic Corporation, Osaka (JP)

(72) Inventors: Yuji Kishida, Hyogo (JP); Kazuhiro Yokota, Hyogo (JP); Arinobu Kanegae, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/130,939

(22) PCT Filed: May 29, 2013

(86) PCT No.: PCT/JP2013/003398
§ 371 (c)(1),
(2) Date: Jan. 6, 2014

(87) PCT Pub. No.: WO2013/183254
PCT Pub. Date: Dec. 12, 2013

(65) Prior Publication Data
US 2014/0159044 A1    Jun. 12, 2014

(30) Foreign Application Priority Data
Jun. 8, 2012    (JP) .................................. 2012-130826

(51) Int. Cl.
*H01L 21/00*    (2006.01)
*H01L 29/04*    (2006.01)
(Continued)

(52) U.S. Cl.
CPC ........ *H01L 29/78606* (2013.01); *G02F 1/1368* (2013.01); *H01L 27/3262* (2013.01); *H01L 29/66765* (2013.01); *H01L 27/1248* (2013.01)
USPC .............................. 438/149; 438/151; 257/72

(58) Field of Classification Search
CPC . H01L 27/1214; H01L 27/13; H01L 27/1222; H01L 29/76; H01L 29/66765; H01L 29/78606; H01L 27/1248; H01L 27/3252; G02F 1/1368

USPC ........... 257/40, 59, 66, 72; 438/149, 151, 158
See application file for complete search history.

(56) References Cited

U.S. PATENT DOCUMENTS 6,100,954 A * 8/2000 Kim et al. ..................... 349/138
6,500,701 B2 * 12/2002 Higashi et al. ............... 438/149
(Continued)

FOREIGN PATENT DOCUMENTS

JP        8-296067       11/1996
JP     2002-261287        9/2002
(Continued)

OTHER PUBLICATIONS

U.S. Appl. No. 14/130,941 to Yuji Kishida et al., filed Jan. 6, 2014.
(Continued)

*Primary Examiner* — Nikolay Yushin
(74) *Attorney, Agent, or Firm* — Greenblum & Bernstein, P.L.C.

(57) ABSTRACT

A method for manufacturing a thin-film transistor, includes: preparing a substrate; forming a gate electrode above the substrate; forming a gate insulating layer above the gate electrode; forming a semiconductor film above the gate insulating layer; forming, above the semiconductor film, a protective layer comprising an organic material; forming a source electrode and a drain electrode above the protective layer; forming a semiconductor layer patterned, by performing dry etching on the semiconductor film; removing at least a portion of a region of an altered layer, the region contacting the semiconductor layer, the altered layer being a surface layer of the protective layer that is altered by the dry etching; and forming a passivation layer having a major component identical to a major component of the protective layer so as to contact the semiconductor layer in a region in which the altered layer has been removed.

21 Claims, 23 Drawing Sheets

(51) Int. Cl.
*H01L 29/786* (2006.01)
*G02F 1/1368* (2006.01)
*H01L 29/66* (2006.01)
*H01L 27/12* (2006.01)
*H01L 27/32* (2006.01)

(56) References Cited

U.S. PATENT DOCUMENTS

| | | |
|---|---|---|
| 7,768,009 B2 | 8/2010 | Kobayashi et al. |
| 7,791,075 B2 | 9/2010 | Kobayashi et al. |
| 8,133,771 B2 | 3/2012 | Kobayashi et al. |
| 8,278,665 B2 | 10/2012 | Asanuma et al. |
| 8,389,993 B2 | 3/2013 | Kobayashi et al. |
| 8,420,462 B2 | 4/2013 | Kobayashi et al. |
| 8,759,917 B2* | 6/2014 | Park et al. ............... 257/347 |
| 2005/0258427 A1* | 11/2005 | Chan et al. ............... 257/72 |
| 2009/0057672 A1 | 3/2009 | Kobayashi et al. |
| 2009/0065784 A1 | 3/2009 | Kobayashi et al. |
| 2010/0194719 A1 | 8/2010 | Saitoh et al. |
| 2010/0285624 A1 | 11/2010 | Kobayashi et al. |
| 2010/0304515 A1 | 12/2010 | Kobayashi et al. |
| 2011/0073863 A1 | 3/2011 | Asanuma et al. |
| 2011/0163310 A1* | 7/2011 | Park et al. ............... 257/43 |
| 2012/0056173 A1* | 3/2012 | Pieralisi ............... 257/43 |
| 2012/0129288 A1 | 5/2012 | Kobayashi et al. |
| 2012/0241750 A1* | 9/2012 | Chikama et al. ............... 257/71 |
| 2013/0001559 A1 | 1/2013 | Kishida et al. |
| 2013/0026479 A1* | 1/2013 | Kawashima et al. ............... 257/66 |
| 2013/0161622 A1* | 6/2013 | Lee ............... 257/57 |

FOREIGN PATENT DOCUMENTS

| | | |
|---|---|---|
| JP | 2003-101146 | 4/2003 |
| JP | 2009-076894 | 4/2009 |
| JP | 2009-081425 | 4/2009 |
| JP | 2010-278077 | 12/2010 |
| JP | 2011-071440 | 4/2011 |
| WO | 2009/144918 | 12/2009 |

OTHER PUBLICATIONS

U.S. Appl. No. 14/236,698 to Yuji Kishida et al., filed Feb. 3, 2014.
International Search Report (ISR) in International Patent Application No. PCT/JP2013/003398, dated Aug. 27, 2013.

* cited by examiner (a) (b)

(a) (b)

(a) (b)

[Conventional example]

[Comparative example]

hydrofluoric acid treatment (SiN / SiO = 460 nm / 0 nm)

w/o hydrofluoric acid treatment (SiN / SiO = 460 nm / 0 nm)

hydrofluoric acid treatment (SiN / SiO = 440 nm / 20 nm)

[Variation 1]

hydrofluoric acid treatment (SiN / SiO = 440 nm / 20 nm)

[Variation 1]

hydrofluoric acid treatment (SiN / SiO = 260 nm / 200 nm)

THIN-FILM TRANSISTOR AND METHOD FOR MANUFACTURING THIN-FILM TRANSISTOR

TECHNICAL FIELD

The present invention relates to thin-film transistors and methods for manufacturing the thin-film transistors, and particularly to a thin-film transistor including an etch-stopper layer comprising organic application materials, and a method for manufacturing the thin-film transistor.

BACKGROUND ART

In recent years, organic EL displays using electroluminescence (EL) of an organic material have been attracting attention as a type of next-generation flat panel display replacing liquid crystal displays. In an active-matrix display device such as the organic EL display, a thin-film semiconductor device referred to as a thin-film transistor (TFT) is used.

Unlike the voltage-driven liquid crystal display, the organic EL display is a current-driven display device. Accordingly, there is an urgent need for development of a thin-film transistor having excellent turn-on/off characteristics as a driving circuit for the active-matrix display device. The thin-film transistor includes a gate electrode, an insulating layer, a semiconductor layer (channel layer), a source electrode, and a drain electrode formed above a substrate. Generally, a silicon thin-film is used as the channel layer.

Increased size and reduced cost are also required for the display device, and a bottom-gate thin-film transistor in which a gate electrode is formed on a side close to the substrate with respect to the channel layer is generally used as a thin-film transistor which allows cost reduction easily.

The bottom-gate thin-film transistor is generally divided into two types; namely, a channel etching thin-film transistor which includes an etched channel layer, and an etch-stopper (channel protective) thin-film transistor in which the channel layer is protected from etching.

Compared to the etch-stopper thin-film transistor, the channel etching thin-film transistor has advantages in the reduced number of photolithography process and a lower manufacturing cost.

In contrast, with the etch-stopper thin-film transistor, it is possible to prevent the damage on the channel layer by etching, suppressing an increase in the variation of characteristics within a surface of the substrate. Furthermore, the channel layer of the etch-stopper thin-film transistor can be thinner than the channel layer of the channel etching thin-film transistor. Accordingly, parasitic resistance component can be reduced and the turn-on characteristics can be improved, which are advantageous for increasing definition.

Therefore, the etch-stopper thin-film transistor is suitable for a driving transistor in the current-driven organic EL display device using an organic EL element, for example, and there are attempts to use the etch-stopper thin-film transistor in a pixel circuit in the organic EL display device even if the manufacturing cost is higher than the manufacturing cost when the channel-etching thin-film transistor is used.

For example, patent literature 1 discloses an etch-stopper TFT in which a microcrystalline semiconductor film is used as a channel layer, and an etch-stopper layer is formed above a channel layer with a buffer layer provided in between.

CITATION LIST

Patent Literature

[PTL 1]
Japanese Unexamined Patent Application Publication No. 2009-076894

SUMMARY OF INVENTION

Technical Problem

However, use of organic materials for the etch-stopper layer in the etch-stopper thin-film transistor causes a marked hump, referred to as hump phenomenon, in the transistor characteristics (I-V characteristics).

In particular, such marked hump phenomenon appears in a region in which current of the transistor characteristics rapidly increases. The region in which current rapidly increases corresponds to a low gray scale region, that is, a black display region in a display device. Unlike the liquid crystal display, the characteristics in the black display region are important for the organic EL display.

The present invention has been conceived to solve the above problem, and has an object to provide (i) an etch-stopper thin-film transistor including an etch-stopper layer comprising organic materials, with reduced hump phenomenon and (ii) a method for manufacturing the thin-film transistor.

Solution to Problem

In order to achieve the above object, the method for manufacturing the thin-film transistor according to an aspect of the present invention includes: preparing a substrate; forming a gate electrode above the substrate; forming a gate insulating layer above the gate electrode; forming a semiconductor film above the gate insulating layer; forming, above the semiconductor film, an etch-stopper layer comprising an organic material; forming a source electrode and a drain electrode that are opposed to each other, each of the source electrode and the drain electrode having at least a portion located above the etch-stopper layer; forming a semiconductor layer patterned, by performing dry etching on the semiconductor film; removing at least a portion of a region of an altered layer, the region contacting the semiconductor layer, the altered layer being a surface layer of the etch-stopper layer that is (i) exposed from the source electrode and the drain electrode and (ii) altered by the dry etching; and forming a passivation layer so as to contact the semiconductor layer in a region in which the altered layer has been removed, the passivation layer having a major component identical to a major component of the etch-stopper layer.

Advantageous Effects of Invention

According to an aspect of the present invention, it is possible to provide a thin-film transistor with excellent transistor characteristics, in particular, where hump phenomenon is reduced in a region in which current rapidly increases.

BRIEF DESCRIPTION OF DRAWINGS

In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

In FIG. 4, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

In FIG. 9, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

In FIG. 17, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

DESCRIPTION OF EMBODIMENTS

Figure 1:
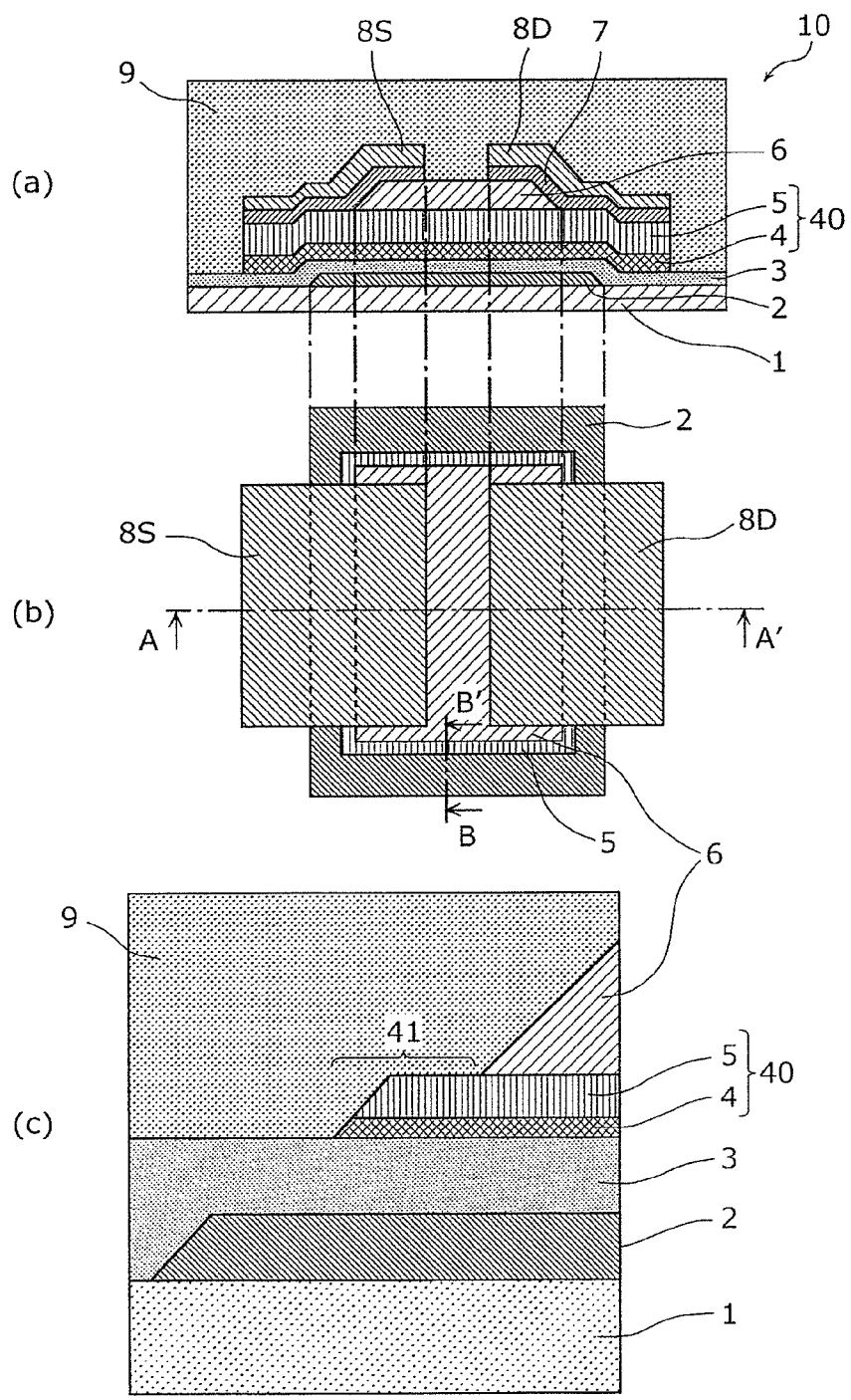
FIG. 1 schematically shows a configuration of a thin-film transistor according to an embodiment of the present invention.

The method for manufacturing the thin-film transistor according to an aspect of the present invention includes: preparing a substrate; forming a gate electrode above the substrate; forming a gate insulating layer above the gate electrode; forming a semiconductor film above the gate insulating layer; forming, above the semiconductor film, an etch-stopper layer comprising an organic material; forming a source electrode and a drain electrode that are opposed to each other, each of the source electrode and the drain electrode having at least a portion located above the etch-stopper layer; forming a semiconductor layer patterned, by performing dry etching on the semiconductor film; removing at least a portion of a region of an altered layer, the region contacting the semiconductor layer, the altered layer being a surface layer of the etch-stopper layer that is (i) exposed from the source electrode and the drain electrode and (ii) altered by the dry etching; and forming a passivation layer so as to contact the semiconductor layer in a region in which the altered layer has been removed, the passivation layer having a major component identical to a major component of the etch-stopper layer.

According to the aspect, of the altered layer formed near the surface of the etch-stopper layer when dry etching is performed on the semiconductor film, at least a portion of the region which contacts the semiconductor layer is removed, and a passivation layer having a major component identical to that of the etch-stopper layer is formed so as to contact the semiconductor layer exposed in the region where the altered layer has been removed. This reduces occurrence of a parasitic transistor caused due to the altered layer, which allows manufacturing of a thin-film transistor with reduced hump phenomenon.

Furthermore, in the method for manufacturing the thin-film transistor according to an aspect of the present invention, it may be that the altered layer has a density higher than a density of a portion of the etch-stopper layer which is not altered by the dry etching.

According to the aspect, the altered layer is a region having a density higher than that of the base of the etch-stopper layer. With this, it is possible to distinguish the etch-stopper layer serving as a protective film of the semiconductor layer from the altered layer, allowing the altered layer to be identified. Furthermore, such an altered layer includes a large amount of fixed charges, which causes hump phenomenon. Since it is possible to reduce occurrence of a parasitic transistor by removing the altered layer which causes hump phenomenon, it is possible to achieve a thin-film transistor with excellent transistor characteristics.

Furthermore, in the method for manufacturing the thin-film transistor according to an aspect of the present invention, it may be that the altered layer has a thickness of at least 30 nm. Furthermore, in the method for manufacturing the thin-film transistor according to an aspect of the present invention, it may be that the altered layer has a chlorine concentration which is at least ten times higher than a chlorine concentration of the etch-stopper layer. Furthermore, in the method for manufacturing the thin-film transistor according to an aspect of the present invention, it may be that the altered layer has a carbon concentration which is at most one hundredth of a carbon concentration of the etch-stopper layer. However, the carbon concentration significantly varies depending on the materials. Hence, the carbon concentration in the altered layer may exceed $1/100$ of the carbon concentration in the etch-stopper layer.

With these configuration, it is possible to distinguish the etch-stopper layer serving as a protective film of the semiconductor layer from the altered layer to be removed, allowing clearly identifying the altered layer. Furthermore, such an altered layer includes a large amount of fixed charges, which causes hump phenomenon. Since only the altered layer which causes the hump phenomenon can be removed, it is possible to achieve a thin-film transistor with excellent transistor characteristics.

Furthermore, in the method for manufacturing the thin-film transistor according to an aspect of the present invention, it may be that, in the removing, the altered layer is removed by dilute hydrofluoric acid.

This allows the altered layer formed due to damages from dry etching to be easily and selectively removed.

Furthermore, in the method for manufacturing the thin-film transistor according to an aspect of the present invention, it may be that the dilute hydrofluoric acid has a concentration of at least 0.5%, and, in the removing, the altered layer is removed by performing cleaning using the dilute hydrofluoric acid over at least ten seconds.

This allows the entire altered layer formed due to damages from dry etching to be reliably removed.

Furthermore, in the method for manufacturing the thin-film transistor according to an aspect of the present invention, it may be that the passivation layer comprises a material identical to a material of the etch-stopper layer.

With this, it is possible to form the passivation layer using an organic material identical to that of the etch-stopper layer.

Furthermore, in the method for manufacturing the thin-film transistor according to an aspect of the present invention, it may be that the passivation layer comprises an inorganic material. In this case, it may be that the etch-stopper layer comprises silicon as a major component, and the passivation layer comprises oxide silicon.

Furthermore, in the method for manufacturing the thin-film transistor according to an aspect of the present invention, it may be that the passivation layer has a thickness of at least 20 nm and at most 1000 nm.

Furthermore, it may be that the method for manufacturing the thin-film transistor according to an aspect of the present invention further includes forming, above the passivation layer, a sealing layer comprising a material having an oxygen transmission rate lower than an oxygen transmission rate of the passivation layer. In this case, it may be that the sealing layer comprises silicon nitride.

With this, even when a material for reducing hump phenomenon is selected as a material for the passivation layer, it is also possible to reduce transmission of oxygen by the sealing layer. More specifically, the sealing layer can also serve as a passivation film. As a result, it is possible to achieve a thin-film transistor with excellent reliability.

Furthermore, a thin-film transistor according to an aspect of the present invention includes a gate electrode above a substrate; a gate insulating layer above the gate electrode; a semiconductor layer that is opposed to the gate electrode with the gate insulating layer therebetween; an etch-stopper layer above the semiconductor layer and comprising an organic material; a source electrode and a drain electrode that are opposed to each other, each of the source electrode and the drain electrode having at least a portion located above the etch-stopper layer; and a passivation layer above the etch-stopper layer, in which the etch-stopper layer has a surface portion and a portion located further inward than the surface portion which are uniform in composition, and the passivation layer covers a border between (i) a surface of the etch-stopper layer and (ii) the semiconductor layer, and an outer peripheral region that is a surface of the semiconductor layer and located further outward than the border relative to a region where the etch-stopper layer is located, the passivation layer contacting the border and the outer peripheral region and having a major component identical to a major component of the etch-stopper layer.

According to the aspect, the etch-stopper layer includes a surface portion and a portion located further inward than the surface portion which are uniform in composition. In addition, the etch-stopper layer has a major component identical to that of the passivation layer. The passivation layer covers the border between (i) a surface of the etch-stopper layer and (ii) the semiconductor layer, and an outer peripheral region that is a surface of the semiconductor layer and located further outward than the border relative to the region where the etch-stopper layer is located, while contacting the border and the outer peripheral region. With this, it is possible to achieve a thin-film transistor with excellent transistor characteristics with reduced hump phenomenon.

Furthermore, in the method for manufacturing the thin-film transistor according to an aspect of the present invention, it may be that the etch-stopper layer has a uniform composition throughout.

Furthermore, in the method for manufacturing the thin-film transistor according to an aspect of the present invention, it may be that the semiconductor layer includes a protruding portion protruding from the etch-stopper layer in a gate width direction, and the protruding portion has an upper surface covered with the passivation layer.

Furthermore, in the method for manufacturing the thin-film transistor according to an aspect of the present invention, it may be that the passivation layer comprises an inorganic material. In this case, it may be that the etch-stopper layer comprises silicon as a major component, and the passivation layer comprises silicon oxide.

Furthermore, in the method for manufacturing the thin-film transistor according to an aspect of the present invention, it may be that the passivation layer has a thickness of at least 20 nm and at most 1000 nm.

It may be that the method for manufacturing the thin-film transistor according to aspect of the present invention further includes a sealing layer above the passivation layer and comprising a material having an oxygen transmission rate lower than an oxygen transmission rate of the passivation layer. In this case, it may be that the sealing layer comprises silicon nitride.

Embodiment

The following shall describe a thin-film transistor and a method for manufacturing the thin-film transistor according to an embodiment of the present invention, with reference to the drawings. The exemplary embodiment described below shows a preferred specific example. The numerical values, shapes, materials, structural elements, the arrangement and connection of the structural elements, steps, the processing order of the steps etc. shown in the following exemplary embodiment are mere examples, and therefore do not limit the scope of the present invention. Therefore, among the structural elements in the following exemplary embodiment, structural elements not recited in any one of the independent claims are not necessarily required to achieve the object of the present invention, but are described as more preferable implementations.

Furthermore, in each of the drawings, substantially same structural elements are assigned with the same referential numerals. Note that each figure is a schematic diagram, and is not necessarily accurate.

FIG. 1 schematically shows a configuration of a thin-film transistor according to the embodiment of the present invention. In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

As shown in FIG. 1, a thin-film transistor 10 according to this embodiment is a channel protective bottom-gate thin-film transistor, and includes: a substrate 1; a gate electrode 2 on the substrate 1; a gate insulating layer 3 on the gate electrode 2; a semiconductor layer 40 that is opposed to the gate electrode 2 with the gate insulating layer 3 therebetween; a protective layer 6 on the semiconductor layer 40; a source electrode 8S and a drain electrode 8D each of which has at least a portion located above the protective layer 6; and a passivation layer 9 formed above the protective layer 6.

The thin-film transistor 10 according to this embodiment further includes a pair of contact layers 7. Each of the contact layers 7 has at least a portion located on the protective layer 6, and is formed between (i) the semiconductor layer 40 and (ii) the source electrode 8S or the drain electrode 8D.

The semiconductor layer 40 is patterned into an island shape above the substrate 1, and includes stacked films of: a crystalline silicon semiconductor layer 4 serving as a first semiconductor layer that is a lower layer; and an amorphous silicon semiconductor layer 5 serving as a second semiconductor layer that is an upper layer. The semiconductor layer 40 is opposed to the gate electrode 2 with the gate insulating layer 3 therebetween.

The thin-film transistor 10 according to this embodiment is an n-channel TFT. The following shall specifically describe elements of the thin-film transistor 10 according to this embodiment.

The substrate 1 is a glass substrate comprising, for example, a glass material such as silica glass, alkali-free glass, or highly heat-resistant glass. An undercoat layer comprising silicon nitride ($SiN_x$), silicon oxide ($SiO_y$), silicon oxynitride ($SiO_yN_x$), or others may be formed on the substrate 1 in order to prevent impurities such as sodium and phosphorus in the glass substrate from entering the semiconductor layer 40. In addition, the undercoat layer also functions as a layer for buffering the heat on the substrate 1 in a high-temperature thermal treatment process such as laser annealing. The thickness of the undercoat layer is, for example, approximately 100 nm to 2000 nm.

The gate electrode 2 is formed on the substrate 1 in a predetermined shape. The gate electrode 2 has a single-layer structure or a multi-layer structure that comprises a conductive material which withstands melting-point temperature of silicon, an alloy including the materials, or the like. Examples of the materials of the gate electrode 2 include molybdenum (Mo), aluminum (Al), copper (Cu), tungsten (W), tantalum (Ta), niobium (Nb), nickel (Ni), titanium (Ti), chromium (Cr), and molybdenum-tungsten (MoW). The thickness of the gate electrode 2 is, for example, approximately 20 nm to 500 nm.

The gate insulating layer 3 (gate insulating film) is formed above the substrate 1. In this embodiment, the gate insulating layer 3 is formed over the entire surface of the substrate 1 covering the gate electrode 2. The gate insulating layer 3 may comprise, for example, silicon oxide ($SiO_y$), silicon nitride ($SiN_x$), silicon oxynitride ($SiO_yN_x$), aluminum oxide ($AlO_z$), or tantalum oxide ($TaO_w$), or may be made of a stacked film of the materials. The thickness of the gate electrode 3 is, for example, approximately 50 nm to 300 nm.

In this embodiment, the crystalline silicon semiconductor layer 4 serves as the semiconductor layer 40. Accordingly, at least silicon oxide is used for the gate insulating layer 3, for example. The reason is that it is preferable to have good interface state between the semiconductor layer 40 and the gate insulating layer 3 for maintaining excellent threshold voltage characteristics of the TFT, and silicon oxide is suitable for this purpose.

The crystalline silicon semiconductor layer 4 is a semiconductor thin film formed on the gate insulating layer 3, and is a channel layer having a predetermined channel region in which movement of carriers are controlled by the voltage applied to the gate electrode 2. The channel region refers to a region above the gate electrode 2. The length of the channel region in the charge movement direction corresponds to the gate length. The crystalline silicon semiconductor layer 4 may be formed by crystallizing amorphous silicon, for example.

The grain size of the crystalline silicon in the crystalline silicon semiconductor layer 4 is, for example, approximately 5 nm to 1000 nm. In this case, the crystalline silicon semiconductor layer 4 may comprise only polycrystalline silicon having an average grain size of 100 nm or more. Other than this, the crystalline silicon semiconductor layer 4 may have a mixed crystal structure of the polycrystalline silicon and microcrystalline silicon referred to as microcrystal having an average grain size of at least 20 nm and less than 40 nm, or a mixed crystal structure of amorphous silicon and crystalline silicon. In order to achieve excellent turn-on characteristics, at least the channel region of the crystalline silicon semiconductor layer 4 is formed of a film having a high ratio of crystalline silicon, for example. Note that, the thickness of the crystalline silicon semiconductor layer 4 is, for example, approximately 10 nm to 90 nm.

The amorphous silicon semiconductor layer 5 is a semiconductor thin film formed on the crystalline silicon semiconductor layer 4, and is, for example, an intrinsic amorphous silicon film. Note that, the thickness of the amorphous silicon semiconductor layer 5 is, for example, approximately 10 nm to 60 nm.

As shown in (b) and (c) in FIG. 1, the semiconductor layer 40 including the crystalline silicon semiconductor layer 4 and the amorphous silicon semiconductor layer 5 has a protruding portion 41 protruding from the protective layer 6 in the gate width direction (direction perpendicular to the channel direction), in the portion exposed from the source electrode 8S and the drain electrode 8D. In other words, in the portion exposed from the source electrode 8S and the drain electrode 8D, the lateral side of the protective layer 6 recedes inside the lateral side of the semiconductor layer 40. There is a step between the protective layer 6 and the semiconductor layer 40. In this embodiment, the protruding portion 41 of the semiconductor layer 40 is also formed in the gate length direction (channel direction). As described later, the upper surface and the lateral surface of the protruding portion 41 are covered with the passivation layer 9.

The semiconductor layer 40 according to this embodiment has a stacked structure of the crystalline silicon semiconductor layer 4 and the amorphous silicon semiconductor layer 5, but the present invention is not limited to the example. The semiconductor layer 40 may include only a silicon semiconductor layer made of the crystalline silicon semiconductor layer or the amorphous silicon semiconductor layer. Furthermore, examples of the semiconductor layer 40 include a metal oxide semiconductor layer and an organic semiconductor layer, other than the silicon semiconductor layer.

The protective layer 6 is an etch-stopper layer formed on the semiconductor layer 40, and is a channel protective film for protecting the semiconductor layer 40 that is to be a channel layer. More specifically, the protective layer 6 functions as a channel etch-stopper (CES) layer for preventing the channel region of the semiconductor layer 40 from being etched during the etching process for patterning the pair of the contact layers 7 and the semiconductor layer 40. The protective layer 6 according to this embodiment is formed on the amorphous silicon semiconductor layer 5. In this embodiment, the thickness of the protective layer 6 in the region overlapping with the source electrode 8S or the drain electrode 8D is, for example, 300 nm to 1 μm. Furthermore, the thickness of the protective layer 6 is at least 500 nm and at most 1 μm, for example. The lower limit of the thickness of the protective layer 6 is determined in consideration for margin due to etching and reduction in effect of fixed charges in the protective layer 6. The upper limit of the thickness of the protective layer 6 is determined in consideration for suppressing a decrease in process reliability due to discontinuity of the contact layer 7 or the like caused by an increase in the level difference between the protective layer 6 and the amorphous silicon semiconductor layer 5.

The protective layer 6 comprises silicon (Si) and oxygen (O) as major components. The protective layer 6 according to this embodiment is an organic material film mainly comprising organic materials including silicon, oxygen, and carbon (C). In this case, the protective layer 6 may comprise, for example, polysiloxane. Polysiloxane has silica bonding as a main chain to which organic components having carbon such as methyl are combined. The protective layer 6 may be formed by applying an organic application material by the spin coating or others. Other than the application method such as the spin coating, the protective layer 6 may be formed by a droplet discharging method or a printing method, such as the screen printing or the offset printing, which allows formation of a predetermined pattern.

The protective layer 6 has a surface portion and a portion located further inward than the surface portion which are uniform in composition. Specifically, the protective layer 6 has a uniform composition throughout. In this embodiment, each of elemental components in the protective layer 6 is substantially uniform in concentration throughout the layer. The protective layer 6 has insulation properties. The pair of contact layers 7 is not electrically connected to each other.

The pair of contact layers 7 is formed of amorphous semiconductor layers having a high concentration of impurities or polycrystalline semiconductor layers having a high concentration of impurities. The pair of contact layers 7 may be, for example, n-type semiconductor layers formed by doping phosphorous (P) in the amorphous silicon as n-type impurity, and be $n^+$ layers including a high concentration of impurities of at least $1 \times 10^{19}$ [atm/cm$^3$].

The pair of contact layers 7 is opposed to each other at a predetermined distance on the protective layer 6. Each of the contact layers 7 is formed from the upper surface of the protective layer 6 covering the amorphous silicon semiconductor layer 5. The thickness of each of the contact layers 7 may be 5 nm to 100 nm, for example.

The pair of contact layers 7 according to this embodiment is formed between (i) the amorphous silicon semiconductor layer 5 and (ii) the source electrode 8S and the drain electrode 8D, but is not formed on the lateral side of the semiconductor layer 40 (the lateral side of the amorphous silicon semiconductor layer 5 and the lateral side of the crystalline silicon semiconductor layer 4). More specifically, the pair of contact layers 7 is flush with the semiconductor layer 40 (the amorphous silicon semiconductor layer 5 and the crystalline silicon semiconductor layer 4).

The pair of contact layers 7 has a single layer structure, but may include two layers of a low-concentration field relief layer ($n^-$ layer) serving as the lower layer and a high-concentration contact layer ($n^+$ layer) serving as the upper layer. In this case, for example, the low-concentration field relief layer is formed by doping phosphorous (P) of approximately $1 \times 10^{17}$ [atm/cm$^3$].

A pair of the source electrode 8S and the drain electrode 8D are opposed to each other at a predetermined distance, and is formed on the pair of contact layers 7, flush with the contact layers 7.

The source electrode 8S covers one of the ends of the protective layer 6 and the semiconductor layer 40 (the amorphous silicon semiconductor layer 5) via one of the contact layers 7. On the other hand, the drain electrode 8D covers the other end of the protective layer 6 and the semiconductor layer 40 (the amorphous silicon semiconductor layer 5) via the other contact layer 7.

In this embodiment, each of the source electrode 8S and the drain electrode 8D may has a single-layer structure or multi-layer structure comprising a conductive material, an alloy including the materials, or the like. Examples of the materials of the source electrode 8S and the drain electrode 8D include aluminum (Al), molybdenum (Mo), tungsten (W), copper (Cu), titanium (Ti), and chromium (Cr). In this embodiment, the source electrode 8S and the drain electrode 8D have a try-layer structure of MoW/Al/MoW. The thickness of the source electrode 8S and the drain electrode 8D may be, for example, approximately 100 nm to 500 nm.

The passivation layer 9 is formed to cover the source electrode 8S, the drain electrode 8D, and the protective layer 6 exposed between the source electrode 8S and the drain electrode 8D. The thickness of the passivation layer 9 may be, for example, at least 20 nm and at most 1000 nm.

The passivation layer 9 has major components identical to those of the protective layer 6. In this embodiment, since the protective layer 6 comprises silicon and oxygen as major components, the passivation layer 9 also comprises silicon and oxygen as major components. While the protective layer 6 comprises organic materials, the passivation layer 9 comprises inorganic materials. For example, the passivation layer 9 may comprise silicon oxide. The passivation layer 9 may also comprise the organic material identical to that of the protective layer 6.

As shown in (c) in FIG. 1, the passivation layer 9 is formed to cover at least a portion, of the surface (lateral surface) of the protective layer 6, which contacts the semiconductor layer 40 (the amorphous silicon semiconductor layer 5). More specifically, the passivation layer 9 covers the border between (i) the surface of the protective layer 6 and (ii) the semiconductor layer 40 and the outer peripheral region located further outward than the border relative to the region which is a surface of the semiconductor layer 40 and in which the protective layer 6 is located, while contacting the border and the outer peripheral region. Specifically, the passivation layer 9 covers the upper surface and the lateral surface of the protruding portion 41 of the semiconductor layer 40.

The passivation layer 9 is used, for example, in order to prevent impurities such as oxygen and water outside from entering the semiconductor layer materials composing the thin-film transistor 10.

Figure 2:
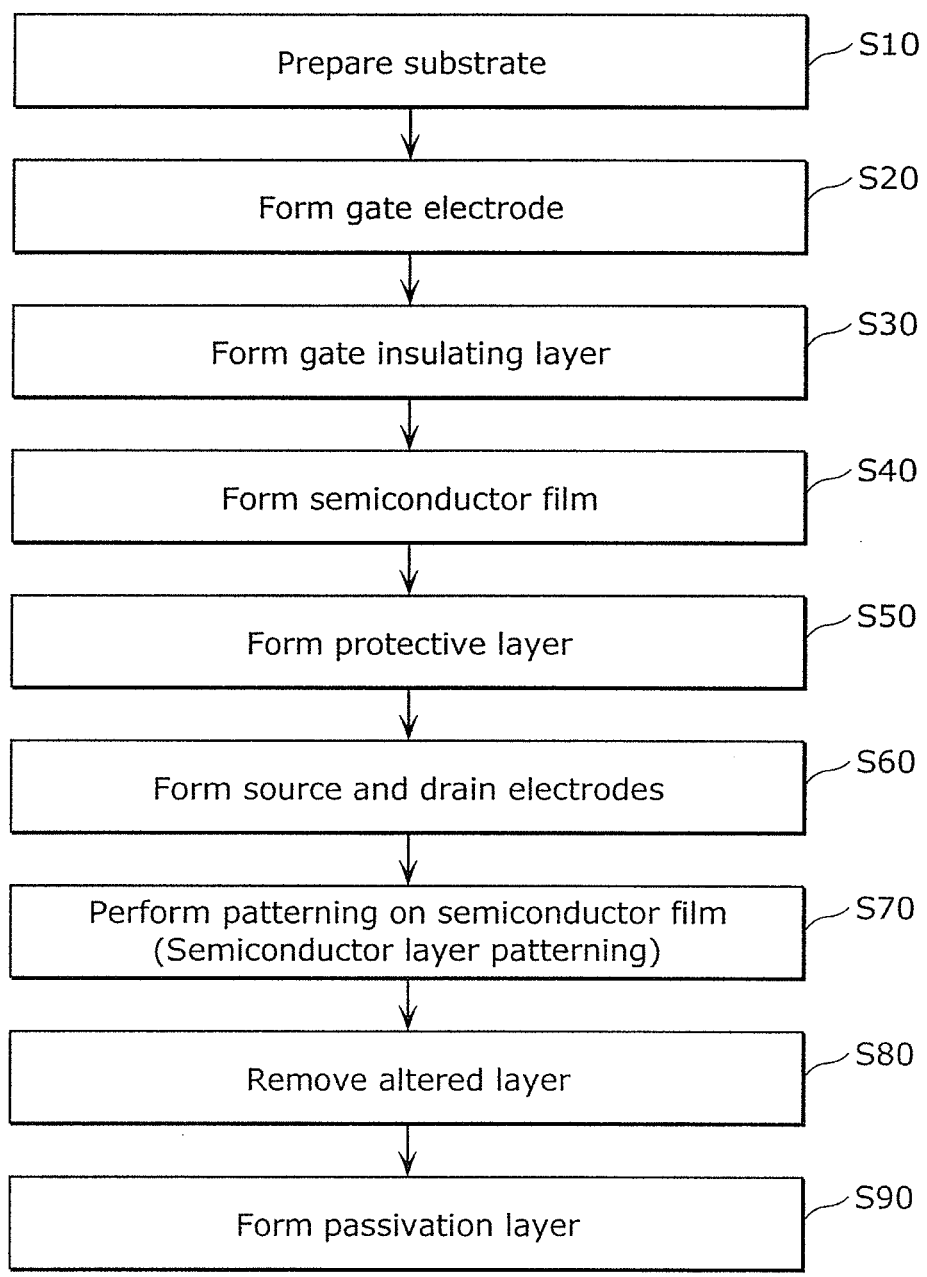
FIG. 2 is a flowchart of a method for manufacturing the thin-film transistor according to the embodiment of the present invention.

Next, the following shall describe a method for manufacturing the thin-film transistor 10 according to the embodiment of the present invention, with reference to FIG. 2 and FIGS. 3A to 3L. FIG. 2 is a flowchart of a method for manufacturing the thin-film transistor according to the embodiment of the present invention. FIGS. 3A to 3L each shows a cross-sectional view and a plan view schematically illustrating each process in the method for manufacturing the thin-film transistor according to the embodiment of the present invention. In each of FIGS. 3A to 3L, (a) shows a cross sectional view of the thin-film transistor taken along line A-A' in (b), and (b) shows a plan view of the thin-film transistor. To facilitate understanding, the same hatching is used for the same structural elements in each of the plan views and cross-sectional views.

As shown in FIG. 2, the method for manufacturing the thin-film transistor 10 according to this embodiment includes: preparing the substrate 1 (S10); forming the gate electrode 2 (S20); forming the gate insulating layer 3 (S30); forming the semiconductor film 40F (S40); forming the protective layer 6 (etch-stopper layer) (S50); forming the source electrode 8S and the drain electrode 8D (S60); patterning the semiconductor film 40F into a predetermined shape by dry etching (S70); removing the altered layer 6a which is a layer generated by alteration of a portion of the protective layer 6 (S80); and forming the passivation layer 9 (S90). The semiconductor film formation (S40) according to this embodiment includes: forming a first semiconductor film; and forming a second semiconductor film. Hereinafter, detailed descriptions are given of each process in the manufacturing method according to this embodiment.

Figure 3A:
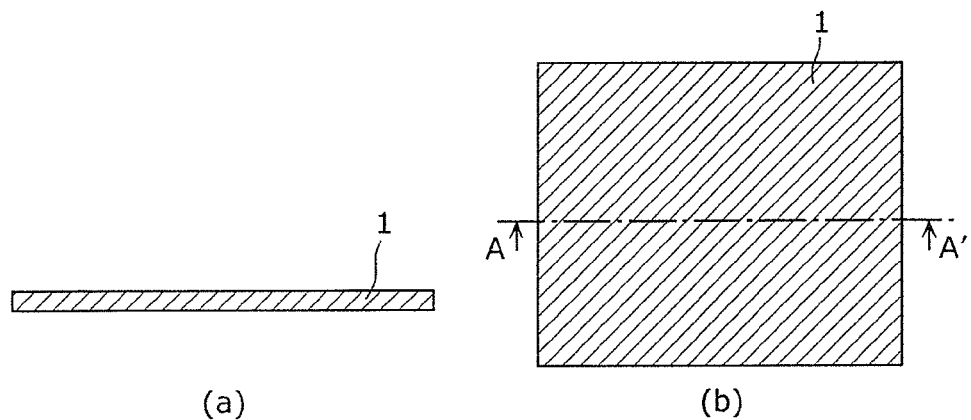
FIG. 3A shows a cross-sectional view and a plan view schematically illustrating a substrate preparation in the method for manufacturing the thin-film transistor according to the embodiment of the present invention.

First, as shown in FIG. 3A, the substrate 1 is prepared (substrate preparation). As the substrate 1, a glass substrate is prepared, for example. Before forming the gate electrode 2, an undercoat layer may be formed on the substrate 1 by the plasma chemical vapor deposition (CVD) or others. Furthermore, the process of preparing the substrate 1 also includes cleaning the substrate 1, for example, other than forming the undercoat layer.

Figure 3B:
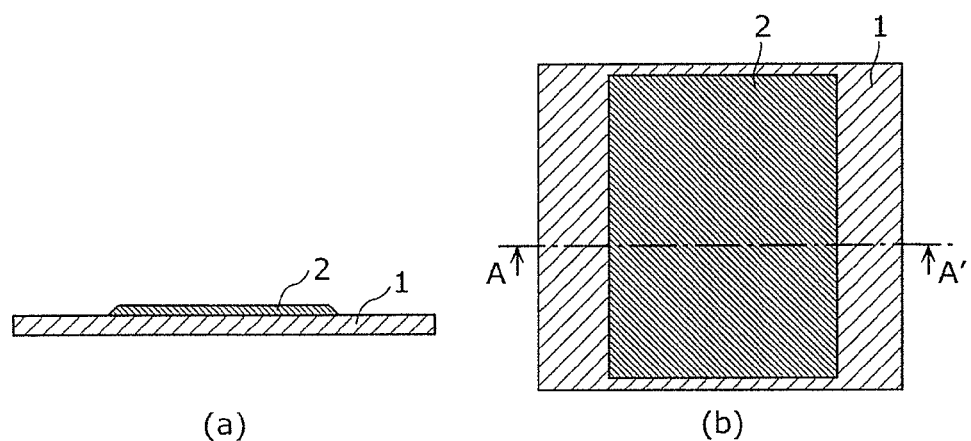
FIG. 3B shows a cross-sectional view and a plan view schematically illustrating a gate electrode formation in the method for manufacturing the thin-film transistor according to the embodiment of the present invention.

Next, as shown in FIG. 3B, the gate electrode 2 in a predetermined shape is formed above the substrate 1 by patterning (gate electrode formation). For example, the gate electrodes 2 in a rectangular shape is formed by forming a gate metal film comprising molybdenum-tungsten (MoW) or the like on the entire surface of the substrate 1 through sputtering, and by patterning the gate metal film using the photolithography and the wet etching.

Figure 3C:
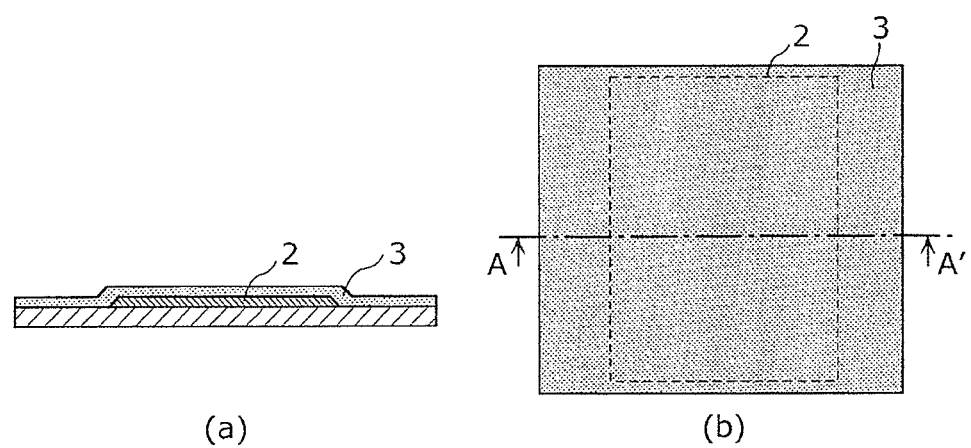
FIG. 3C shows a cross-sectional view and a plan view schematically illustrating a gate insulating layer formation in the method for manufacturing the thin-film transistor according to the embodiment of the present invention.

Next, as shown in FIG. 3C, the gate insulating layer 3 is formed above the substrate 1 (gate insulating layer formation). For example, the gate insulating layer 3 is formed, by the plasma CVD or others, over the entire upper surface of the substrate 1 covering the gate electrode 2. In this embodiment, the gate insulating layer 3 is formed which has a two-layer structure of a silicon oxide film and a silicon nitride film.

Figure 3D:
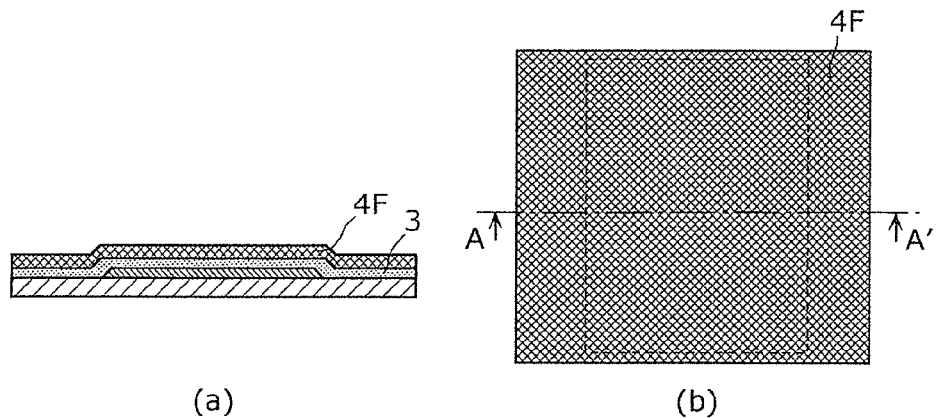
FIG. 3D shows a cross-sectional view and a plan view schematically illustrating a crystalline silicon semiconductor layer formation in the method for manufacturing the thin-film transistor according to the embodiment of the present invention.

Next, as shown in FIG. 3D, the crystalline silicon semiconductor film 4F is formed on the gate insulating layer 3, as the first semiconductor film (first semiconductor film formation). In this case, first, an amorphous silicon thin film made of an amorphous silicon film, for example, is formed on the gate insulating layer 3 by the plasma CVD or others. The amorphous silicon film can be formed under a predetermined film-forming condition, by introducing silane gas ($SiH_4$) and hydrogen gas ($H_2$) in a predetermined ratio of concentration, for example. Subsequently, a dehydrogenation annealing is performed, and the amorphous silicon thin film is annealed in a predetermined temperature so as to crystallize the amorphous silicon thin film. With this, the crystalline silicon semiconductor film 4F is formed on the gate insulating layer 3.

Note that, in this embodiment, the amorphous silicon thin film is crystallized by the laser annealing, which involves irradiating the amorphous silicon thin film with a laser beam. Examples of the laser annealing includes laser annealing using an excimer laser (ELA) with wavelength of 190 nm to 350 nm approximately, laser annealing using a pulse laser with wavelength of 370 nm to 900 nm approximately, and laser annealing using a continuous wave laser (CW laser) with wavelength of 370 nm to 900 nm approximately. Other than the laser annealing, the amorphous silicon thin film may be crystallized by the rapid thermal processing (RTP) or rapid thermal annealing (RTA). Instead of forming the crystalline silicon semiconductor film by crystallizing the amorphous silicon thin film, the crystalline silicon semiconductor film 4F may be formed by directly growing crystals by the CVD.

Figure 3E:
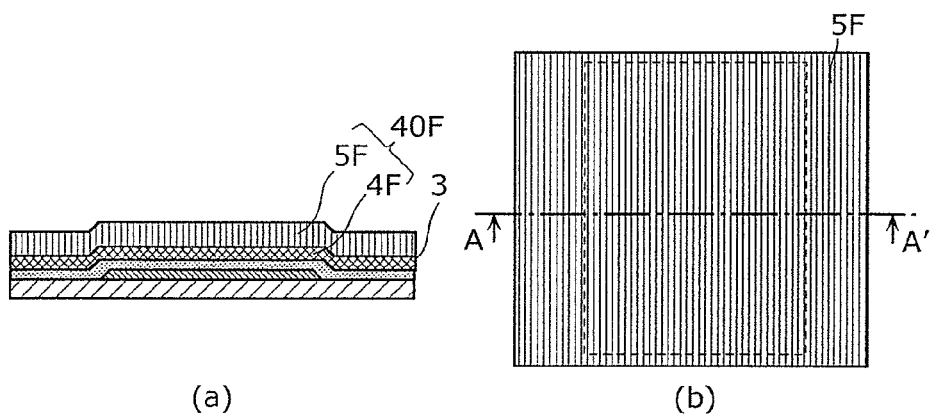
FIG. 3E shows a cross-sectional view and a plan view schematically illustrating an amorphous silicon semiconductor layer formation in the method for manufacturing the thin-film transistor according to the embodiment of the present invention.

Next, as shown in FIG. 3E, an amorphous silicon semiconductor film 5F is formed on the crystalline silicon semiconductor film 4F, as a second semiconductor film (second semiconductor film formation). For example, an amorphous silicon film may be formed as the amorphous silicon semiconductor film 5F. The amorphous silicon film can be formed in a predetermined film-forming condition by the plasma CVD or others, using source gas including silane gas ($SiH_4$), disilane gas ($Si_2H_6$), or trisilane gas ($Si_3H_8$). As an inert gas introduced with the source gas, other than the hydrogen gas ($H_2$), argon gas (Ar) or helium gas (He) may be introduced in a predetermined ratio of concentration to form the amorphous silicon film.

With this, the semiconductor film 40F, which is stacked films of the crystalline silicon semiconductor layer 4F and the amorphous silicon semiconductor film 5F, is formed on the gate insulating layer 3.

After forming the semiconductor film 40F, hydro treatment may be performed on silicon atoms in the crystalline silicon semiconductor film 4F by performing hydrogen plasma treatment on the semiconductor film 40F. The hydrogen plasma treatment is performed, for example, by generating hydrogen plasma by radio-frequency (RF) power from gas including hydrogen gas such as $H_2$ or $H_2$/Argon (Ar), and irradiating the semiconductor film 40F with the hydrogen plasma. The hydrogen plasma treatment generates, in the plasma atmosphere, hydrogen plasma including hydrogen ion ($H^+$) and hydrogen radical ($H^*$). Entry of the generated hydrogen ion and hydrogen radical into the crystalline silicon semiconductor film 4F causes hydrogen termination of dangling-bond of silicon atoms included in the crystalline silicon semiconductor film 4F. More specifically, dangling-bond of silicon atoms is combined with hydrogen. This reduces crystallinity defect density of the crystalline silicon semiconductor film 4F, thereby improving crystallinity of the crystalline silicon semiconductor film 4F. The hydrogen plasma treatment need not be necessarily performed when the semiconductor film 40F is formed of a material other than silicon semiconductor, such as oxide semiconductor, or organic semiconductor.

Figure 3F:
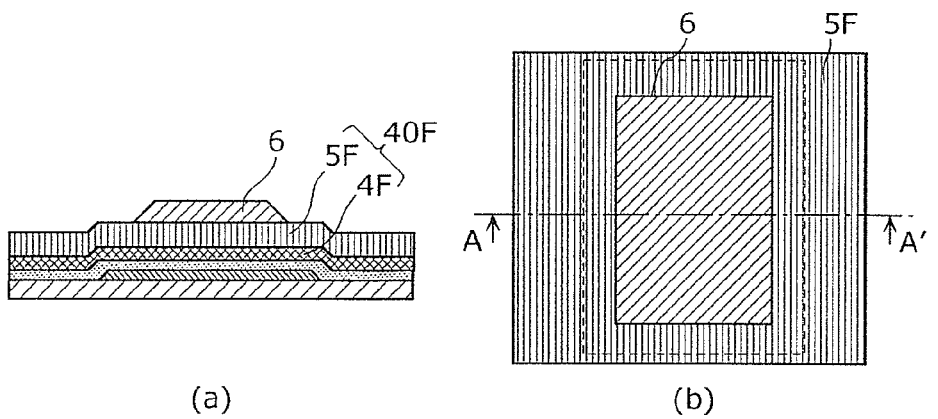
FIG. 3F shows a cross-sectional view and a plan view schematically illustrating a protective layer formation in the method for manufacturing the thin-film transistor according to the embodiment of the present invention.

Next, as shown in FIG. 3F, the protective layer 6 to be an etch-stopper layer is formed on the semiconductor film 40F (protective layer formation). For example, the protective layer 6 made of an organic protective film is formed by applying a predetermined organic material to the semiconductor film 40F by a predetermined application method and baking the organic material.

In this embodiment, an organic material comprising polysiloxane is applied to the amorphous silicon semiconductor film 5F first, and the spin coating is applied. With this, the protective layer 6 is formed on the entire surface of the amorphous silicon semiconductor film 5F. Subsequently, the protective layer 6 is pre-baked. After that, the protective layer 6 in the predetermined shape is formed by exposure and development using a photo mask. After that, post-baking on the protective layer 6 is performed. With this, the protective layer 6 in the predetermined shape is formed.

Figure 3G:
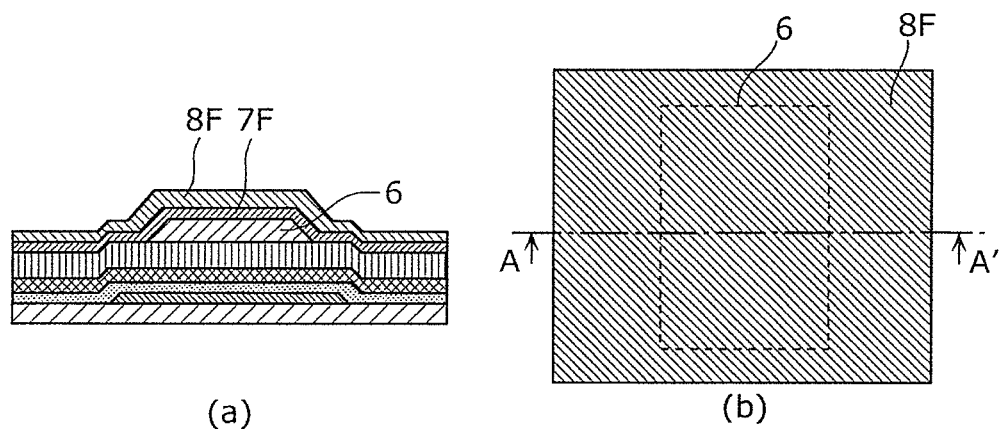
FIG. 3G shows a cross-sectional view and a plan view schematically illustrating a contact layer film formation and a source/drain metal film formation in the method for manufacturing the thin-film transistor according to the embodiment of the present invention.

Next, as shown in FIG. 3G, a contact layer film 7F is formed on the semiconductor film 40F (the amorphous silicon semiconductor film 5F) so as to cover the protective layer 6 (contact layer film formation). For example, the contact layer film 7F comprising amorphous silicon doped with an impurity of pentavalent element such as phosphorous is formed by the plasma CVD.

Next, as shown in FIG. 3G, a source-drain metal film 8F for forming the source electrode 8S and the drain electrode 8D is formed on the contract layer film 7F. For example, the source-drain metal film 8F with a try-layer structure of MoW/Al/MoW is formed by sputtering (source-drain metal film formation).

Figure 3H:
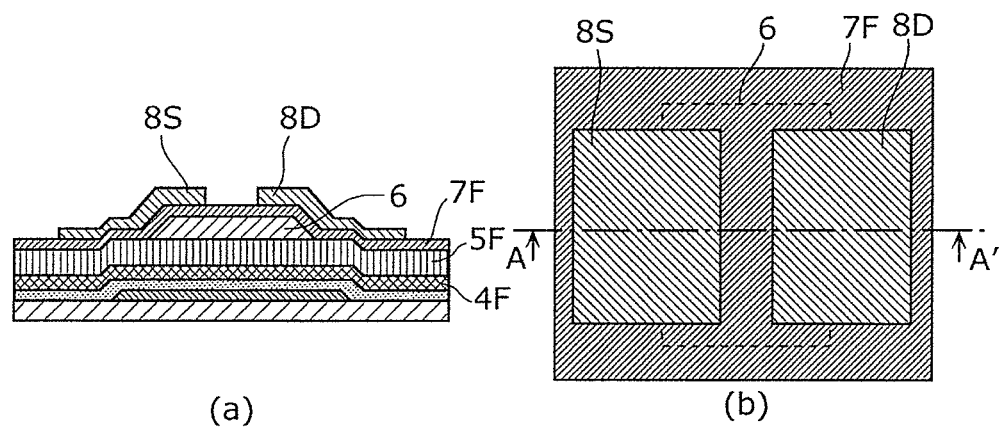
FIG. 3H shows a cross-sectional view and a plan view schematically illustrating a source/drain metal film patterning in the method for manufacturing the thin-film transistor according to the embodiment of the present invention.

Next, as shown in FIG. 3H, a pair of the source electrode 8S and the drain electrode 8D is formed on the amorphous silicon semiconductor film 5F, interposing the protective layer 6, by pattering the source-drain metal film 8F. More specifically, a resist is applied on the source-drain metal film 8F for patterning the source-drain metal film 8F into the predetermined shape, and exposure and development is performed to pattern the resist into a shape corresponding to the shape of the source electrode 8S and the drain electrode 8D. Next, the source-drain metal film 8F is pattern by performing etching such as wet etching using the resist as a mask. With this, as shown in FIG. 3H, the pair of the source electrode 8S and the drain electrode 8D which are separated and in the predetermined shape are formed. Here, note that the contact layer film 7F functions as an etch-stopper.

Figure 3I:
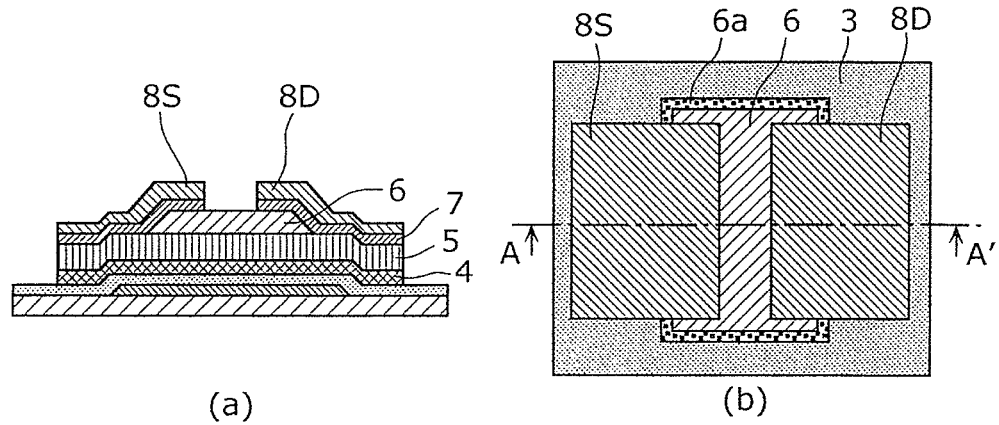
FIG. 3I shows a cross-sectional view and a plan view schematically illustrating a contact layer film patterning and a semiconductor layer patterning in the method for manufacturing the thin-film transistor according to the embodiment of the present invention.

Subsequently, the resist on the source electrode 8S and the drain electrode 8D is removed, and dry etching is performed using the source electrode 8S and the drain electrode 8D as masks so as to pattern the contract layer film 7F. At the same time, the semiconductor film 40F (the amorphous silicon semiconductor film 5F and the crystalline silicon semiconductor film 4F) is patterned into an island shape (semiconductor film patterning). Accordingly, as shown in FIG. 3I, the pair of contact layers 7 in the predetermined shape is formed, and the amorphous silicon semiconductor layer 5 and the crystalline silicon semiconductor layer 4 patterned into the island shape are formed. Here, note that the protective layer 6 functions as an etch-stopper layer.

In this embodiment, the semiconductor film 40F is patterned by a dry etching apparatus in the etching conditions that the etching gas is $Cl_2$ gas, the pressure is 2 Pa, and inductive coupled plasma (ICP) power is 300 W. In this embodiment, dry etching is performed on the semiconductor film 40F after removing the resist on the source electrode 8S and the drain electrode 8D; however, dry etching may be performed without removing the resist.

In such a case, as shown in (b) in FIG. 3I, dry etching performed when patterning the semiconductor film 40F generates the altered layer 6a near the surface of the protective layer 6 in the region of the protective layer 6 exposed from the source electrode 8S and the drain electrode 8D. More specifically, the altered layer 6a is generated by the surface layer of the protective layer 6 exposed from the source electrode 8S and the drain electrode 8D being altered by the etching gas used in the dry etching. Furthermore, as shown in FIG. 3I, the altered layer 6a appears particularly at the lateral sides of the exposed protective layer 6. As described above, the protective layer 6 obtained after performing dry etching on the semiconductor film 40F includes the altered layer 6a which is a portion of the protective layer 6 altered by the dry etching and a bulk layer which is a portion of the protective layer 6 not altered by the dry etching.

Next, in order to remove the altered layer 6a generated at the time of dry etching, for example, wet etching using dilute hydrofluoric acid (DHF) or dry etching using $CF_4$ or $O_2$ is performed (altered layer removal).

Figure 3J:
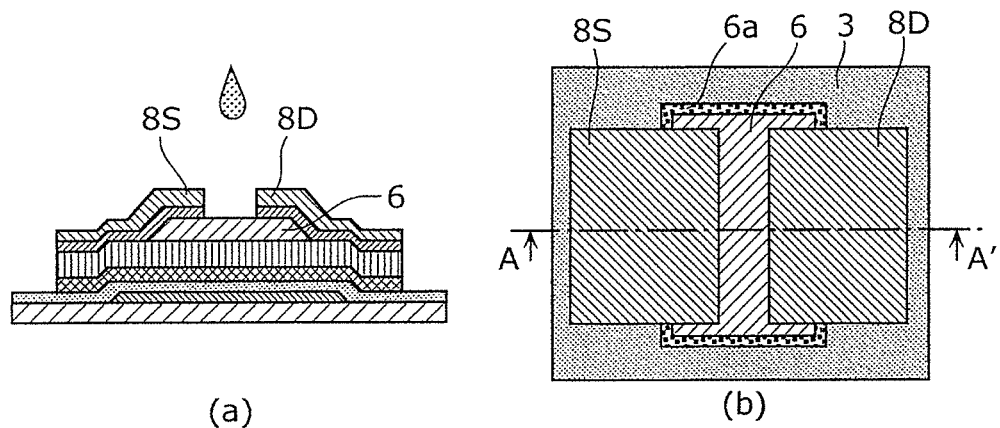
FIG. 3J shows a cross-sectional view and a plan view schematically illustrating an altered layer removal in the method for manufacturing the thin-film transistor according to the embodiment of the present invention.
Figure 3K:
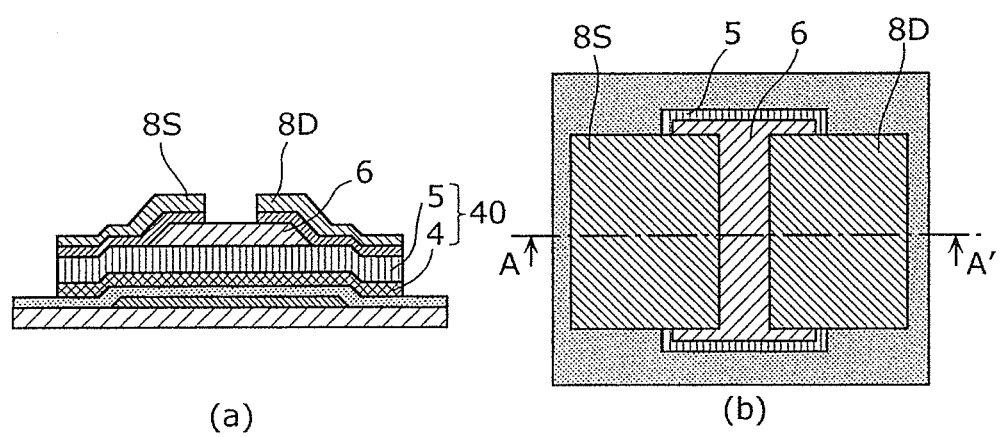
FIG. 3K shows a cross-sectional view and a plan view schematically illustrating a state after the altered layer is removed in the method for manufacturing the thin-film transistor according to the embodiment of the present invention.

In this embodiment, as shown in FIG. 3J, the altered layer 6a formed in the protective layer 6 is selectively removed by performing cleaning over at least ten seconds using DHF with dilution ratio of 0.5%.

By removing the altered layer 6a in such a manner, the lateral sides of the protective layer 6 recede. As a result, as shown in (b) in FIG. 3K, the outer peripheral portion of the semiconductor layer 40 (the amorphous silicon semiconductor layer 5) below the altered layer 6a is exposed.

Figure 3L:
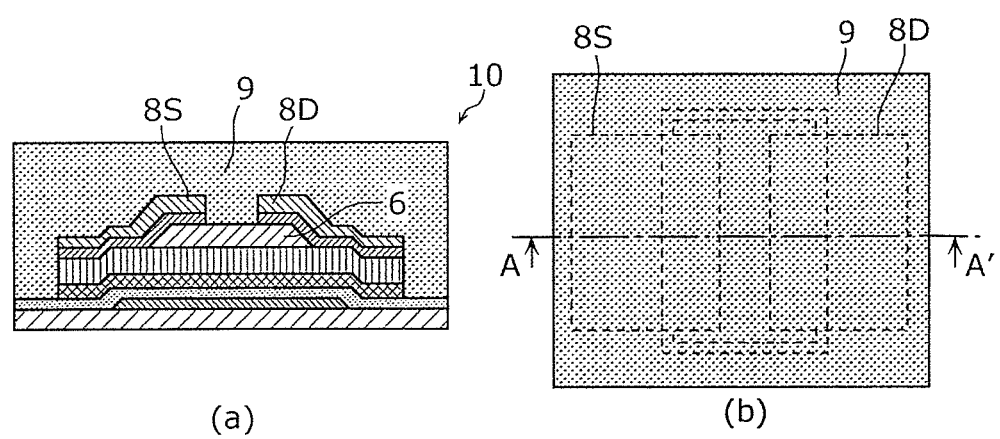
FIG. 3L shows a cross-sectional view and a plan view schematically illustrating a passivation layer formation in the method for manufacturing the thin-film transistor according to the embodiment of the present invention.

Lastly, as shown in FIG. 3L, the passivation layer 9 is formed so as to be in contact with at least the semiconductor layer 40 exposed by removal of the altered layer 6a (passivation layer formation). In this embodiment, the passivation layer 9 is formed so as to cover all of the exposed components (the source electrode 8S, the drain electrode 8D, the protective layer 6, and the amorphous silicon semiconductor layer 5).

The materials for the passivation layer 9 has a major component identical to that of the protective layer 6. In this embodiment, the passivation layer 9 comprising silicon oxide (SiO$_x$) is formed by a parallel-plate electrode RF plasma CVD apparatus. In this case, a film of silicon oxide (SiO$_x$) having a thickness of 20 nm was formed under a film-forming condition in which the temperature (growth temperature) of the substrate 1 provided in the apparatus is 400 degrees Celsius, the pressure is 3 Torr, an RF power is 180 W, the distance between the parallel-plate electrodes is 550 mm and gas flow rates of silane and nitrogen monoxide are 20 sccm and 1500 sccm, respectively.

The thin-film transistor 10 according to this embodiment is manufactured as described above.

Next, detailed descriptions are given of the functions and effects of the thin-film transistor 10 according to this embodiment, including how the present invention was achieved.

Figure 4:
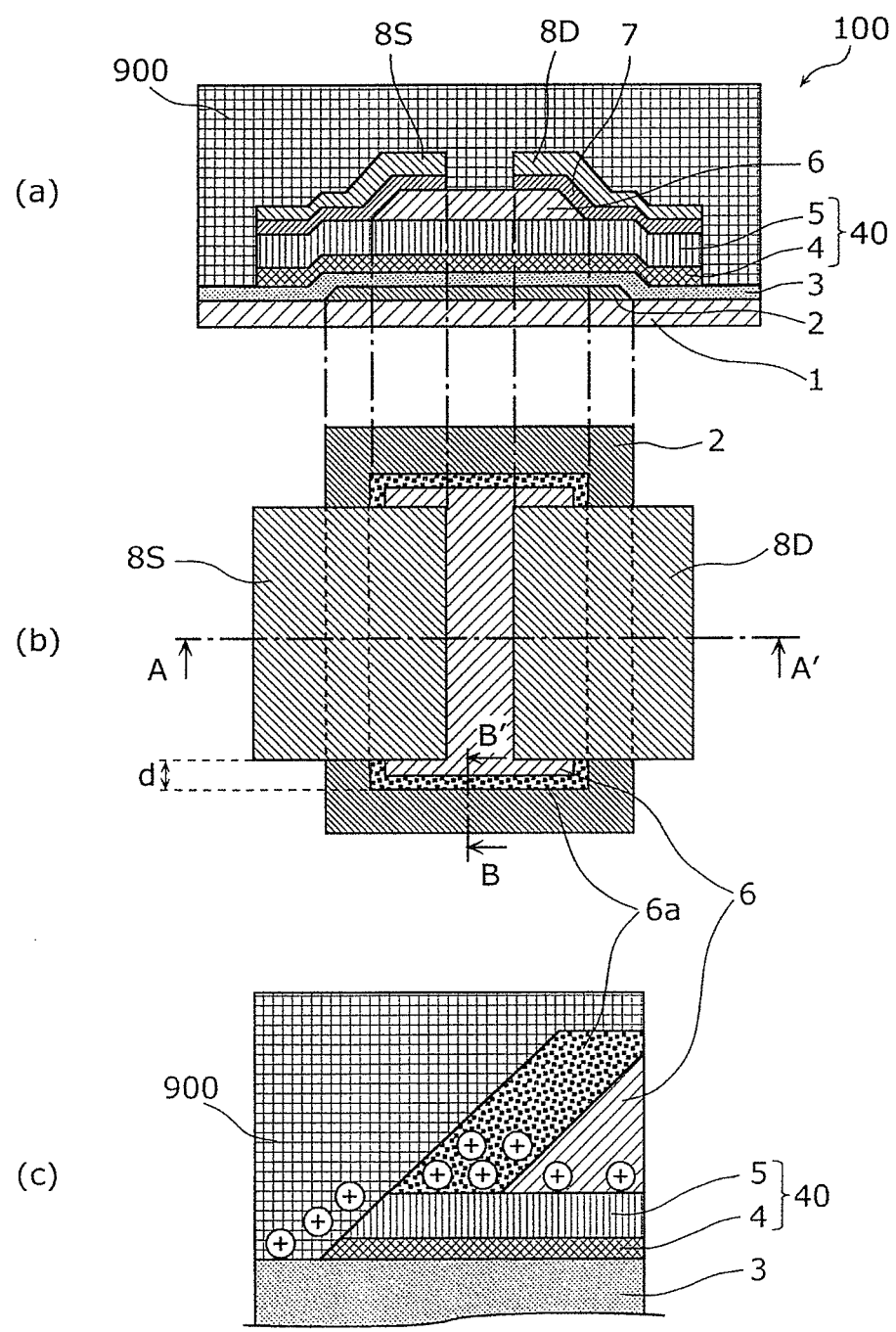
FIG. 4 schematically shows a configuration of a conventional thin-film transistor.
Figure 5A:
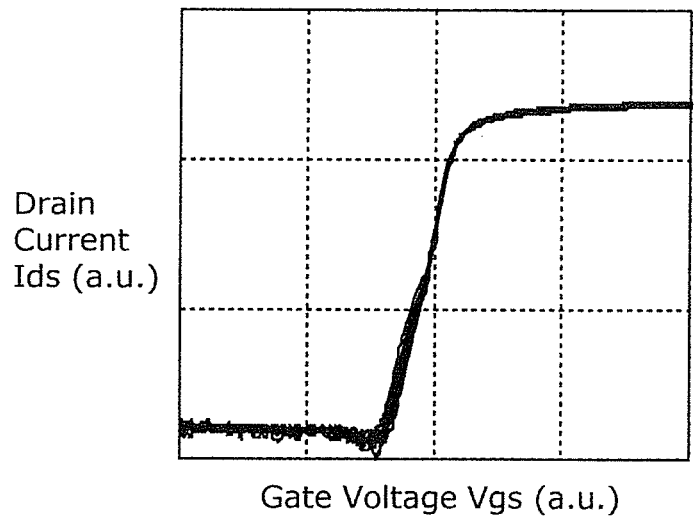
FIG. 5A shows current-voltage characteristics of the conventional thin-film transistor.
Figure 5B:
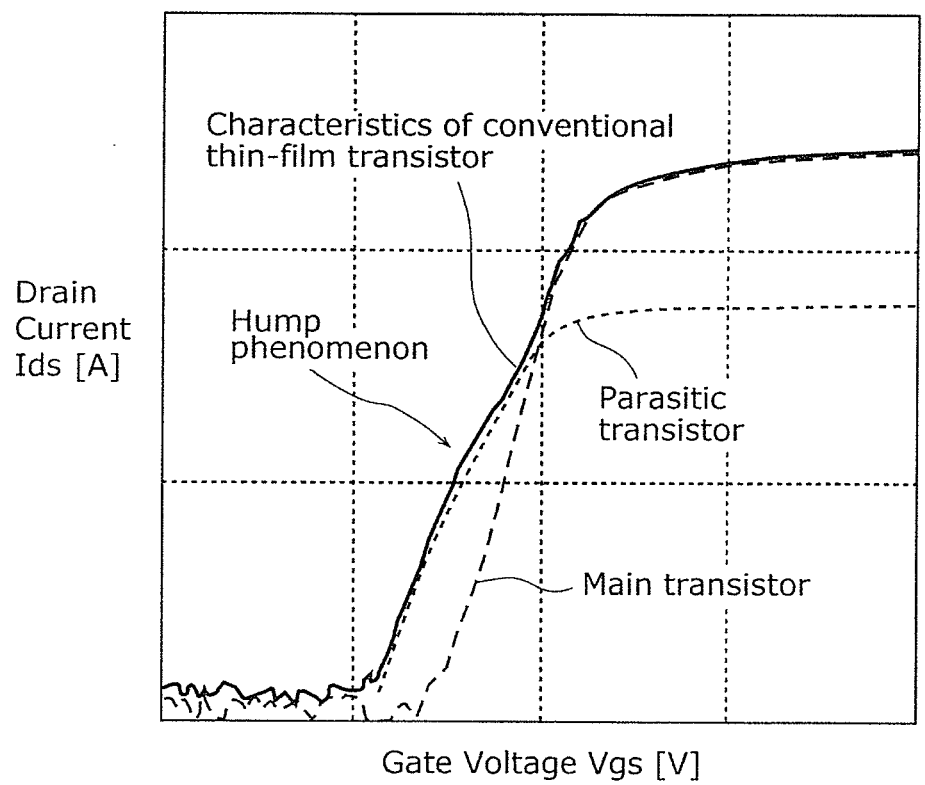
FIG. 5B shows hump phenomenon in the current-voltage characteristics of the conventional thin-film transistor.

FIG. 4 schematically shows a configuration of a conventional thin-film transistor. In FIG. 4, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b). FIG. 5A and FIG. 5B show current-voltage characteristics (Ids-Vgs characteristics) of the conventional thin-film transistor.

As shown in (a) in FIG. 4, the conventional thin-film transistor 100 includes, above the substrate 1, the gate electrode 2, the gate insulating layer 3, the crystalline silicon semiconductor layer 4, the amorphous silicon semiconductor layer 5, the protective layer 6, the pair of contact layers 7, the source electrode 8S, the drain electrode 8D, and the passivation layer 900. The passivation layer 900 comprises silicon nitride having a low oxygen transmission rate.

The conventional thin-film transistor 100 including an etch-stopper layer (protective layer 6) comprising organic application materials has a problem in that it is difficult to obtain desired transistor characteristics (current-voltage characteristics). The current-voltage characteristics of the thin-film transistor 100 were measured. The result shows, as shown in FIG. 5A, that a hump, referred to as hump phenomenon, is included in the range where current rapidly increases. Note that FIG. 5A shows the current-voltage characteristics of the thin-film transistor 100 including the passivation layer 900 having a thickness of 460 nm.

Here, referring to FIG. 5B, a description is given of the hump phenomenon. The hump phenomenon is considered to be caused due to presence of a parasitic transistor other than the main transistor in a single thin-film transistor, as shown in FIG. 5B. The hump phenomenon refers to a phenomenon in which an unnatural hump is included in the current-voltage characteristics of the single thin-film transistor 100 by the current-voltage characteristics of the main transistor being combined with the current-voltage characteristics of the parasitic transistor. Note that in this Description, the organic application materials refer to materials comprising organic materials including carbon, and refers to materials that can be formed by printing process, such as inkjet printing, or application process, such as spin coating.

After diligent analysis and consideration on the cause of the hump phenomenon, the inventors found out the following causes. In the case where an organic application material is used for the etch-stopper layer (protective layer), the exposed etch-stopper layer is damaged when patterning the semiconductor film into a predetermined shape (an island shape). This generates, in the surface of the etch-stopper layer, an altered layer which is generated by alteration of the organic coating material that is a base material of the etch-stopper layer. The inventors also found out that the thickness of the etch-stopper layer decreases at the exposed outer peripheral portion of the etch-stopper layer due to etching. The above finding shows that the parasitic transistor is formed by the newly generated altered layer contacting the semiconductor layer, thereby causing the hump phenomenon.

Figure 6:
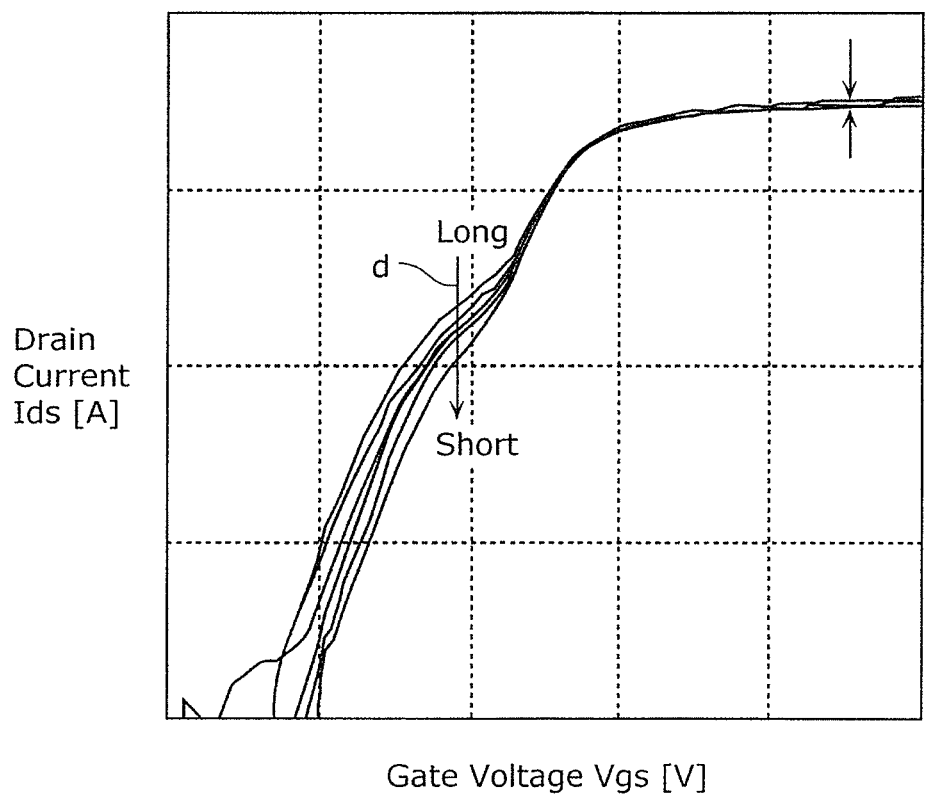
FIG. 6 is a diagram showing respective current-voltage characteristics of the conventional thin-film transistor shown in FIG. 4 obtained when the protective layer and the altered layer protrude, by different length, from the source electrode (drain electrode) in the gate width direction.

Referring to FIG. 6, more detailed descriptions will be given of occurrence of the parasitic transistor. FIG. 6 is a diagram showing respective current-voltage characteristics of the conventional thin-film transistor shown in FIG. 4 obtained when the protective layer 6 protrude, by different length (d), from the source electrode (drain electrode) in the gate width direction.

As shown in FIG. 6, in the current-voltage characteristics of respective thin-film transistors having different protruding length d, saturated current values of the main transistor do not vary, but the saturated current values of the parasitic transistor vary depending on the protruding length d. More specifically, as the protruding length d increases, the saturated current value of the parasitic transistor decreases. This shows that the portion which causes the parasitic transistor, that is, the altered layer 6a is present at the outer peripheral edge portion of the protective layer 6.

Now, referring back to (c) in FIG. 4, detailed descriptions are given of occurrence of the hump phenomenon due to the altered layer 6a. In FIG. 4, (c) shows a cross-sectional view of the neighboring portions of the outer peripheral edge of the protective layer (etch-stopper layer) of the conventional thin-film transistor 100, and schematically shows the amount of fixed charges at the back channel side of the semiconductor layer.

Normally, the entire surface of the semiconductor layer 40 at the back channel side is covered with the protective layer 6 which has uniform composition of elements and a uniform concentration of the composition of the elements, and the amount of fixed charges at the back channel side is uniform within a surface of the substrate. More specifically, in such a case, hump phenomenon does not occur in the current-voltage characteristics of the thin-film transistor.

However, as described above, in the case where the organic application material is used as the material for the protective layer 6, dry etching performed to pattern the semiconductor layer 40 alters the organic application material in the protective layer 6, thereby forming the altered layer 6a. In addition, since etching is performed while the lateral side of the semiconductor layer 40 recedes, the semiconductor 40 contacts the altered layer 6a at the outer peripheral edge portion of the protective layer 6. Hence, as shown in (c) in FIG. 4, the back channel side of the semiconductor layer 40 contacts the altered layer 6a that is a layer generated by the protective layer 6 being altered by dry etching, and also contacts the non-altered layer (bulk layer) that is the protective layer 6 not altered by the dry etching. In this case, the altered layer 6a and the non-altered layer have different amount of fixed charges.

A larger amount of fixed charges is generated in the altered layer 6a which has been damaged. In such a manner, the parasitic transistor is caused because the semiconductor layer 40 contacts the altered layer 6a which includes a larger amount of fixed charges. It is considered that such a parasitic transistor causes the hump phenomenon in the current-voltage characteristics, as shown in FIG. 5A and FIG. 5B.

Figure 7:
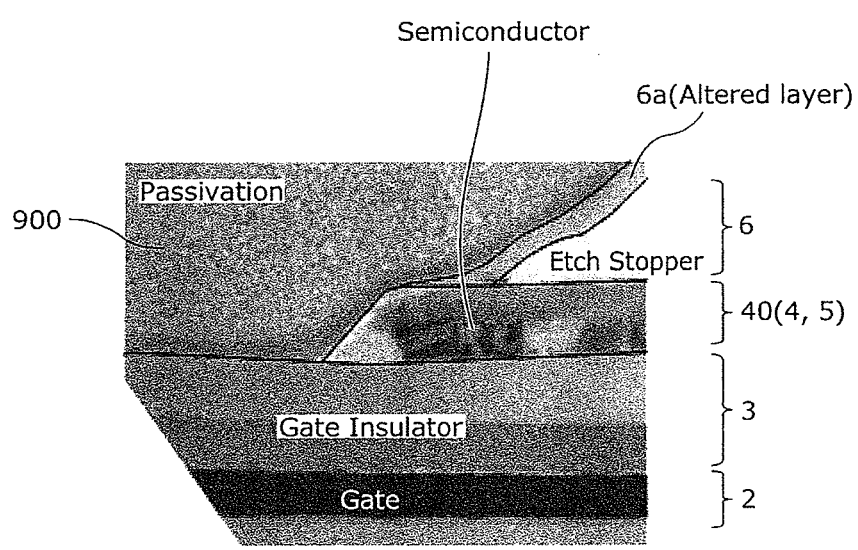
FIG. 7 is a cross-sectional TEM image of an outer peripheral edge portion of the protective layer of the conventional thin-film transistor shown in FIG. 4.

The conventional thin-film transistor 100 shown in FIG. 4 was actually manufactured, and cross-section observation was performed on the portion corresponding to (c) in FIG. 4 using a transmission electron microscope (TEM). FIG. 7 is a cross-sectional TEM image of the neighboring portions of the outer peripheral edge of the protective layer of the conventional thin-film transistor shown in FIG. 4.

The cross-sectional TEM image shown in FIG. 7 shows that the altered layer 6a having a thickness of approximately 30 nm is present on the surface (sloped side) of the protective layer 6 and contacts the semiconductor layer 40 at the outer peripheral edge portion of the protective layer 6. Furthermore, since the color strength in the TEM image represents difference in density (volume density), the TEM image shows that a layer (the altered layer 6a) which is clearly different from the protective layer 6 is present on the surface of the protective layer 6. Furthermore, since the altered layer 6a is darker than the protective layer 6 serving as a base, it can be seen that the density of the altered layer 6a (volume density) is higher than the density (volume density) of the protective layer 6 (non-altered portion) serving as a base.

Figure 8A:
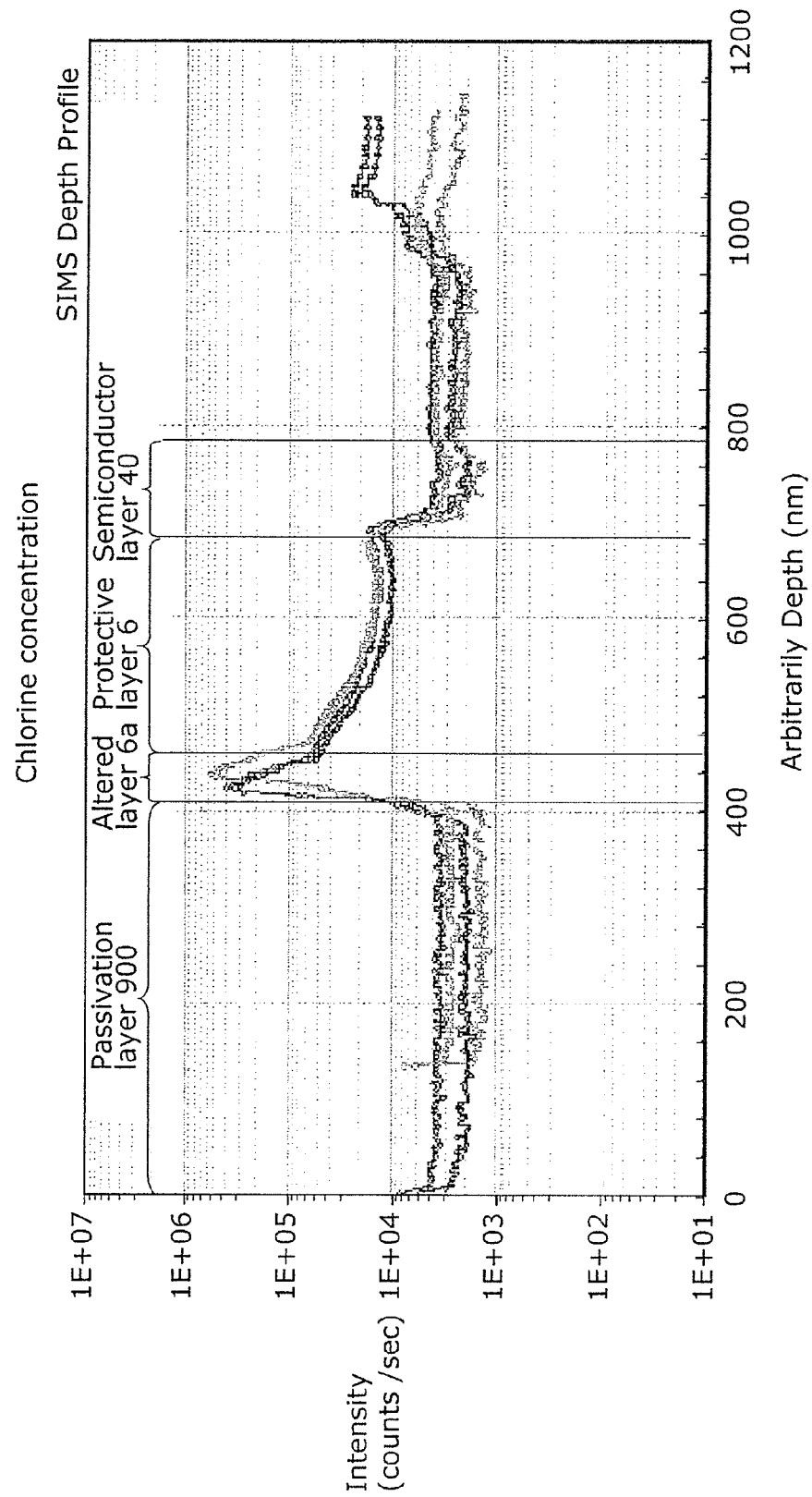
FIG. 8A shows concentration distribution of chlorine in films of the conventional thin-film transistor shown in FIG. 4.
Figure 8B:
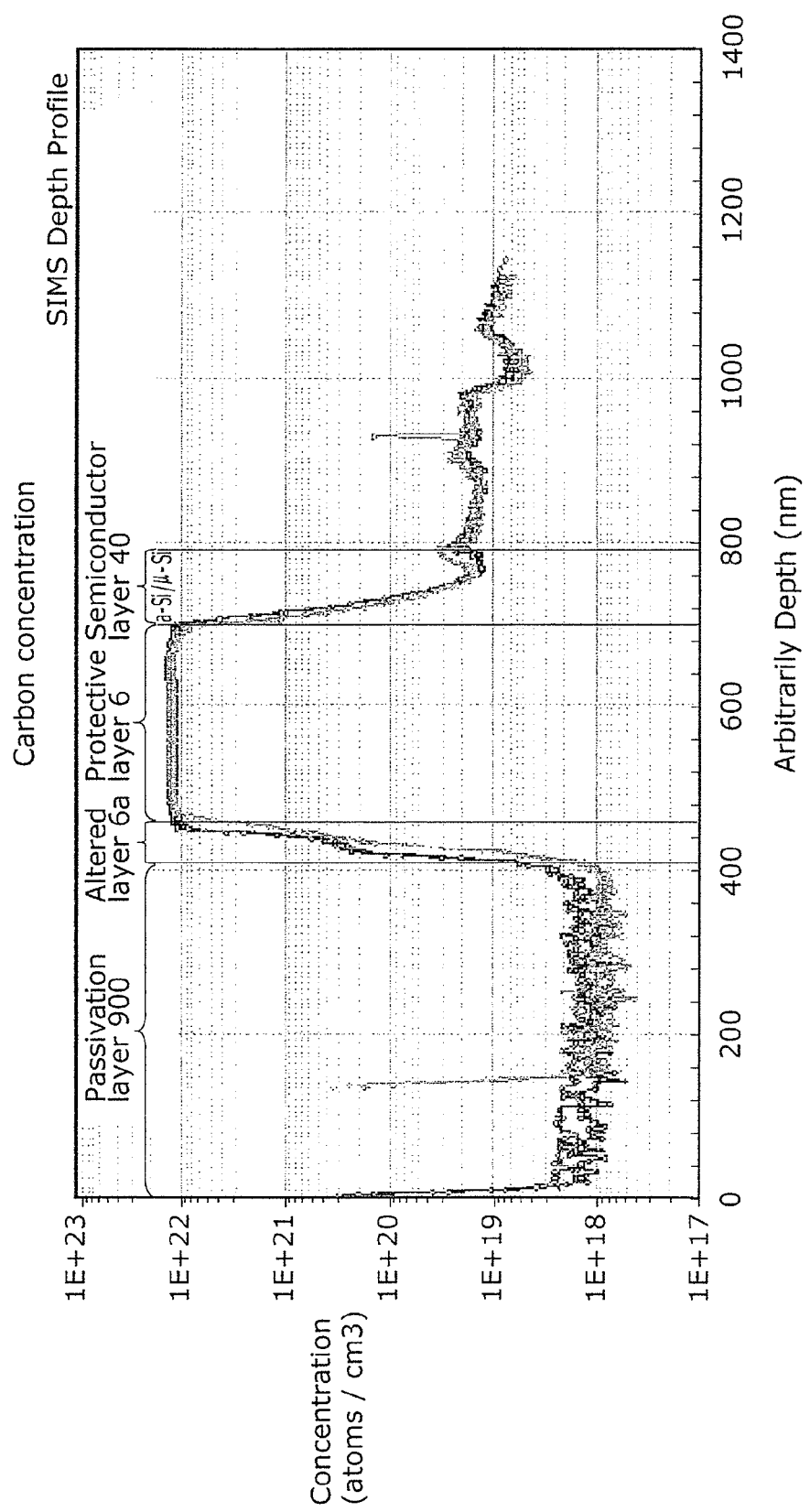
FIG. 8B shows concentration distribution of carbon in the films of the conventional thin-film transistor shown in FIG. 4.

Here, referring to FIG. 8A and FIG. 8B, a description is given of concentration distribution of chlorine (Cl) and carbon (C) in the conventional thin-film transistor 100. FIG. 8A shows concentration distribution of chlorine in the films of the conventional thin-film transistor shown in FIG. 4. FIG. 8B shows concentration distribution of carbon in the films of the conventional thin-film transistor shown in FIG. 4. Note that FIG. 8A and FIG. 8B show results of analysis performed on a single film with use of a secondary ion-microprobe mass spectrometer (SIMS). Furthermore, FIG. 8A and FIG. 8B show analysis results of multiple samples.

FIG. 8A shows that a layer, in which a larger amount of chlorine elements is detected than the other layers, is present between the passivation layer 900 and the protective layer 6. Furthermore, FIG. 8B shows that a layer, which has a higher carbon concentration than that of the passivation layer 900 and a lower carbon concentration than that of the protective layer 6, is present between the passivation layer 900 and the protective layer 6. The layer which appears between the passivation layer 900 and the protective layer 6 is the altered layer 6a which includes a large amount of chlorine elements that is a source gas used in dry etching, other than the composition of the organic application material of the protective layer 6. More specifically, the altered layer 6a is a layer generated by the protective layer 6 being altered by the source gas of the dry etching. Furthermore, since the altered layer 6a has a lower carbon concentration than that of the protective layer 6, it is considered that the altered layer 6a is generated by alteration of carbon in the protective layer 6. As described above, based on the results shown in FIG. 8A and FIG. 8B, it is understood that the altered layer 6a is a layer generated by the organic application material serving as a base for the protective layer 6 being combined with the source gas of dry etching.

FIG. 8A also shows that the altered layer 6a has a chlorine concentration at least ten times higher than that of the protective layer 6. Furthermore, FIG. 8B also shows that the altered layer 6a has a carbon concentration which is at most one hundredth of the carbon concentration of the protective layer 6.

In accordance with above, the inventors found out that presence of the altered layer 6a causes hump phenomenon, and considered that removal of the altered layer 6a by hydrofluoric acid treatment would reduce occurrence of the hump phenomenon.

Figure 9:
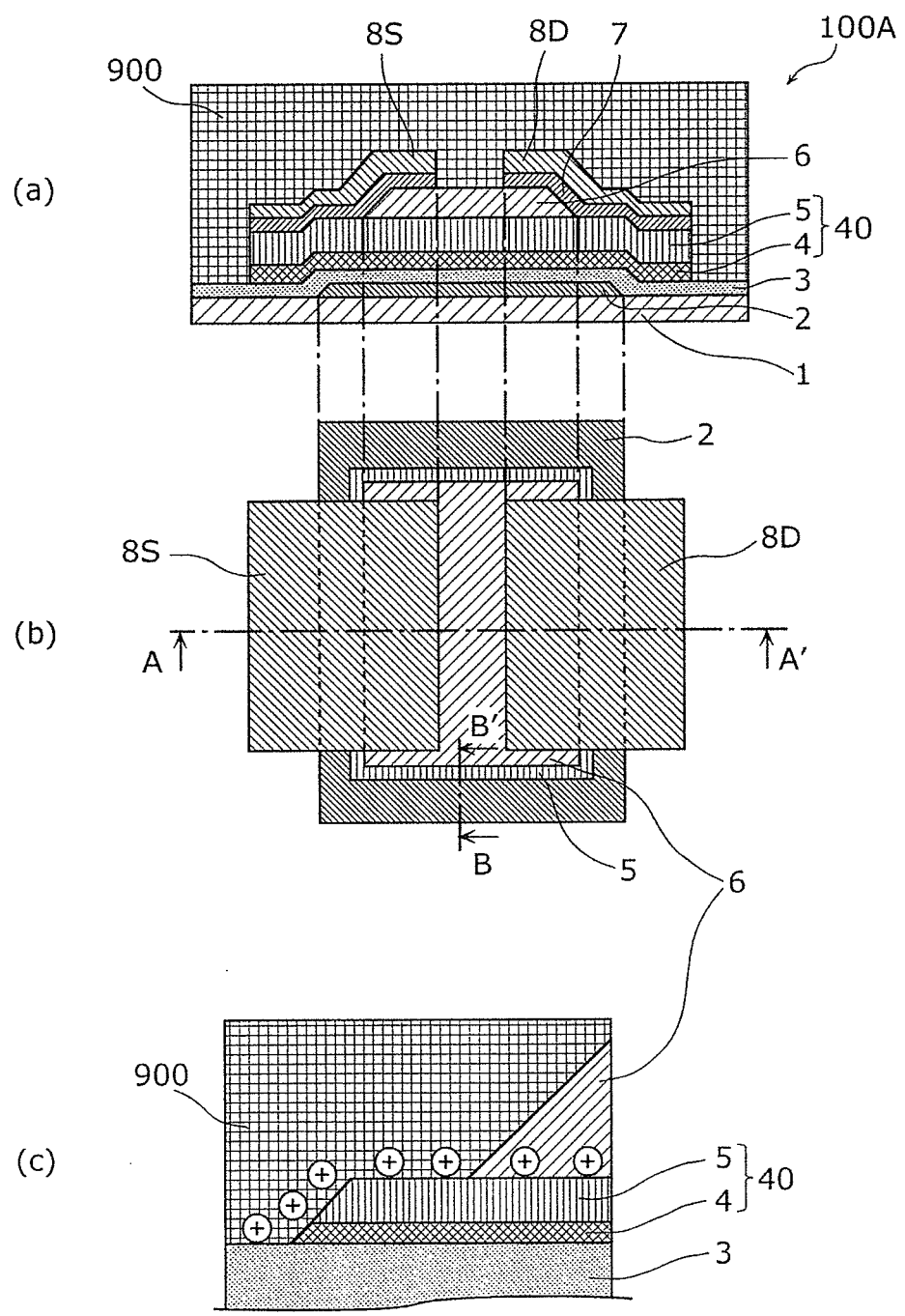
FIG. 9 schematically shows a configuration of a thin-film transistor according to a comparative example in which hydrofluoric acid treatment has been performed.

In light of this, the inventors conducted the following experiments based on the above finding. The experimental results shall be described with reference to FIG. 9. FIG. 9 schematically shows a configuration of a thin-film transistor according to a comparative example in which hydrofluoric acid treatment is performed. In FIG. 9, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

The thin-film transistor 100A according to the comparative example shown in FIG. 9 is obtained by performing hydrofluoric acid treatment on the conventional thin-film transistor shown in FIG. 4 and removing the altered layer 6a. The hydrofluoric acid treatment was performed with use of DHF of 0.5% before forming the passivation layer 900 comprising silicon nitride.

As shown in (b) and (c) in FIG. 9, removal of the altered layer 6a by hydrofluoric acid exposes the upper surface of the edge portion of the semiconductor layer 40 from the protective layer 6. The inventors had considered that this would eliminate the altered layer 6a, thereby reducing occurrence of hump phenomenon.

Figure 10:
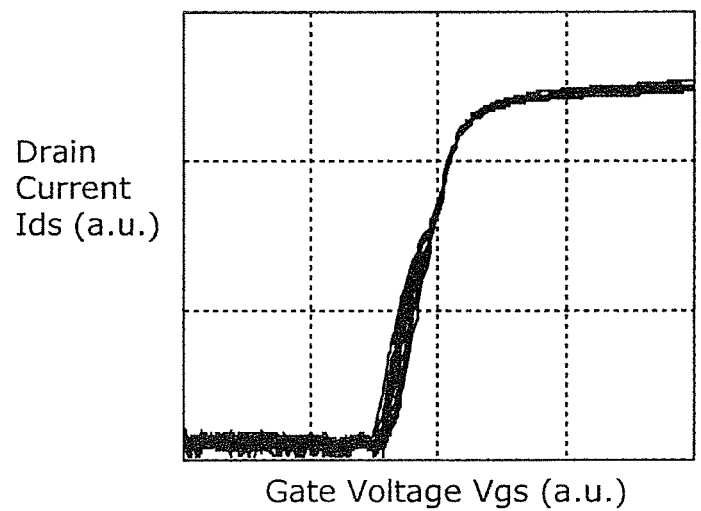
FIG. 10 shows current-voltage characteristics of the thin-film transistor according to the comparative example shown in FIG. 9.

However, after manufacturing the thin-film transistor 100A with the altered layer 6a removed by hydrofluoric acid and measuring the current-voltage characteristics, the inventors found out that even more marked hump phenomenon appeared rather than the hump phenomenon is eliminated. FIG. 10 shows the current-voltage characteristics (Ids-Vgs characteristics) of the thin-film transistor according to the comparative example shown in FIG. 9, and shows the current-voltage characteristics of the thin-film transistor 100A including the passivation layer 900 (SiN) having a thickness of 460 nm formed after removing the altered layer 6a using hydrofluoric acid.

Here, the current-voltage characteristics of the thin-film transistor 100A according to the comparative example in which hydrofluoric acid treatment has been performed (FIG. 10) is compared with the current-voltage characteristics of the conventional thin-film transistor 100 when no hydrofluoric acid treatment has been performed (FIG. 5A). The comparison result shows that the thin-film transistor 100A according to the comparative example in which hydrofluoric acid treatment has been performed has a more marked hump phenomenon than the conventional thin-film transistor on which no hydrofluoric acid treatment has been performed.

After further diligent analysis and consideration on the above, the inventors further found out that occurrence of the hump phenomenon is associated not only with the altered layer generated in the protective layer, but also with the materials of the passivation layer. This point shall be further described with reference to (c) in FIG. 9. In FIG. 9, (c) is a cross-sectional view of the neighboring portions of the outer peripheral edge of the protective layer (etch-stopper layer) in the thin-film transistor 100A according to the comparative example, and schematically shows the amount of fixed charges at the back channel side of the semiconductor layer.

By removing the altered layer 6a, as shown in (c) in FIG. 9, the lateral side of the outer peripheral edge of the protective layer 6 and the upper surface of the semiconductor layer 40 which protrudes directly contact the passivation layer 900. Here, for the materials of the passivation layer 900, silicon nitride is used which has a high sealing effect on oxygen and water. The difference in the amount of fixed charges between the silicon nitride and the protective layer 6 comprising the organic application materials is considered to cause the marked hump phenomenon. More specifically, the marked hump phenomenon is considered to be caused because although the altered layer 6a having the amount of fixed charges different from the protective layer 6 is removed, the passivation layer 900 having a different fixed charge amount appeared in the region where the altered layer 6a has been removed.

Figure 11:
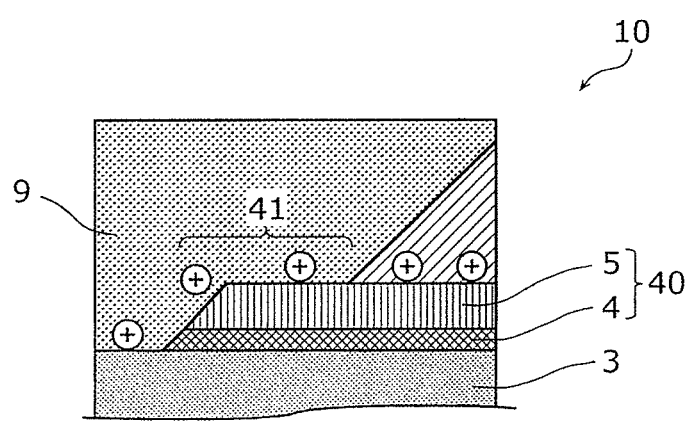
FIG. 11 is an enlarged cross-sectional view of neighboring portions of an outer peripheral edge of the protective layer in the thin-film transistor according to the embodiment of the present invention.

Here, the inventors considered that the passivation layer may be formed using the material having the same amount of fixed charges as the protective layer 6, after removing the altered layer 6a. Accordingly, the inventors have achieved the idea that the hump phenomenon can be reduced by removing the altered layer to obtain a uniform composition throughout the protective layer, and making the major components of the protective layer identical to the major components of the passivation layer which contacts the protective layer. This point shall be specifically described with reference to FIG. 11. FIG. 11 is an enlarged cross-sectional view of the neighboring portions of the outer peripheral edge of the protective layer in the thin-film transistor according to this embodiment, and corresponds to (c) in FIG. 1. FIG. 11 schematically shows the amount of fixed charges at the back channel side of the semiconductor layer.

In this embodiment, the major components of the organic application material included in the protective layer 6 of the thin-film transistor 10 are silicon and oxygen, and are materials close to silicon oxide. Hence, for the material of the passivation layer 9, silicon oxide is used so as to match the major components of the protective layer 6.

More specifically, as shown in FIG. 11, the altered layer 6a generated near the surface of the protective layer 6 by dry etching is removed to obtain a uniform composition of elements and uniform concentration thereof throughout the protective layer 6. In addition, the passivation layer 9 is formed which has a major component identical to that of the protective layer 6, so as to contact the surface of the protruding portion 41 of the semiconductor layer 40 in the region where the altered layer 6a has been removed.

As a result, as shown in FIG. 11, the amount of fixed charges at the back channel side of the semiconductor layer 40 can be equalized within a surface of the substrate. With this, it is possible to reduce occurrence of the hump phenomenon in the current-voltage characteristics of the thin-film transistor 10.

Figure 12:
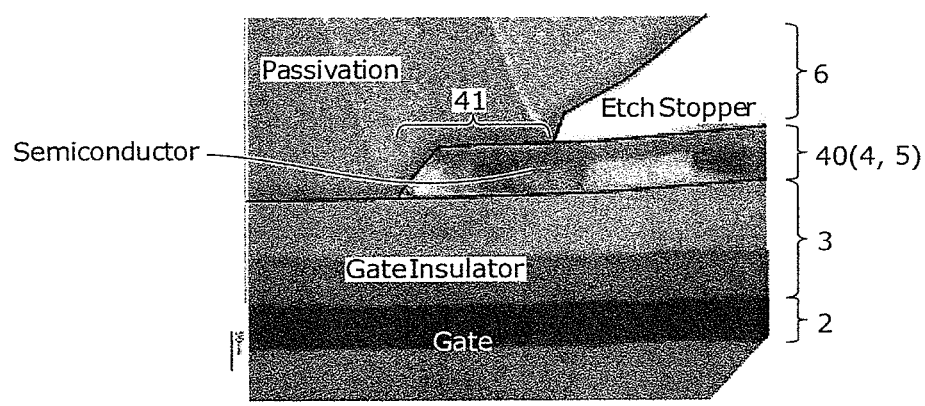
FIG. 12 is a cross-sectional TEM image of neighboring portions of the outer peripheral edge of the protective layer in the thin-film transistor according to the embodiment shown in FIG. 11.

The thin-film transistor 10 having the configuration shown in FIG. 1 was actually manufactured, and cross-sectional observation was performed on the portion corresponding to FIG. 11, with use of TEM. FIG. 12 is a cross-sectional TEM image of the neighboring portions of the outer peripheral edge of the protective layer in the thin-film transistor according to this embodiment shown in FIG. 11. In the thin-film transistor shown in FIG. 11, the altered layer 6a has been removed by dilute hydrofluoric acid.

The TEM image in FIG. 12 shows that all of the altered layer 6a located between the passivation layer 9 and the protective layer 6 has been removed, and the passivation layer 9 is formed so as to contact the surface (lateral side) of the protective layer 6 and the surface (upper surface and the lateral surface) of the protruding portion 41 of the semiconductor layer 40.

As described above, in the thin-film transistor 10 according to the embodiment of the present invention, the altered layer 6a generated near the surface of the protective layer 6 at the time of dry etching of the semiconductor 40 is removed to obtain a uniform composition throughout the protective layer 6, and the passivation layer 9 having a major component identical to that of the protective layer 6 is formed so as to contact the semiconductor layer 40 exposed in the region where the altered layer 6 has been removed. This reduces occurrence of the parasitic transistor caused by the altered layer 6a, thereby providing a thin-film transistor with reduced hump phenomenon.

Figure 13A:
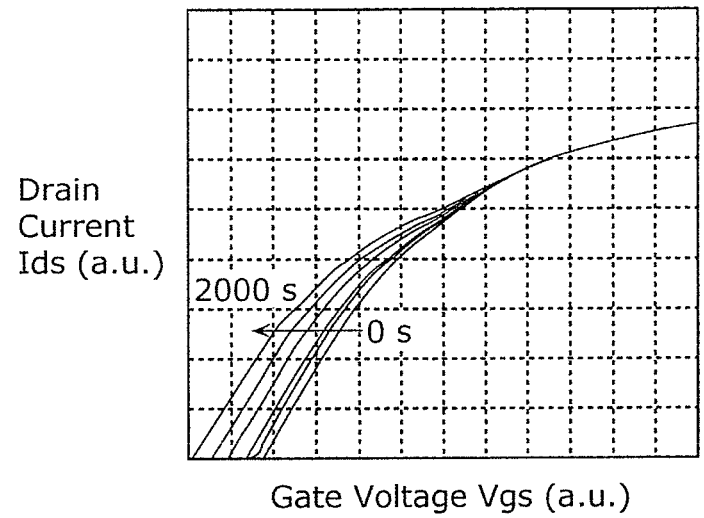
FIG. 13A shows current-voltage characteristics of the conventional thin-film transistor when reliability assessment is performed.
Figure 13B:
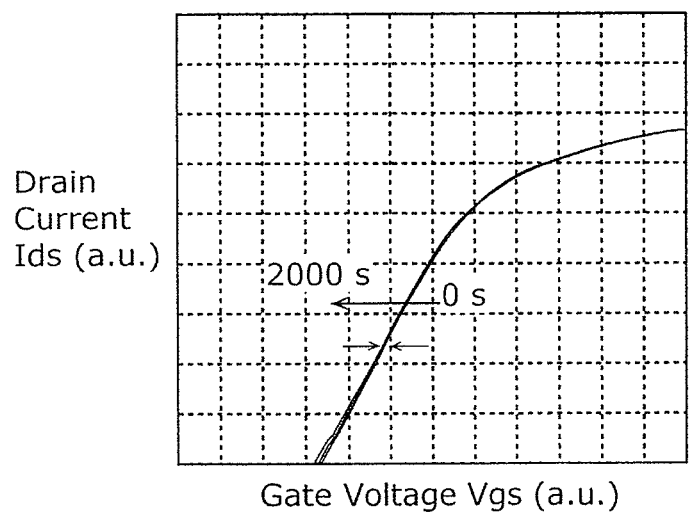
FIG. 13B shows current-voltage characteristics of the thin-film transistor according to the embodiment when reliability assessment is performed.

Furthermore, the thin-film transistor 10 according to this embodiment also improves reliability of the conventional thin-film transistor 100. The following shall describe this point with reference to FIG. 13A and FIG. 13B. FIG. 13A shows the current-voltage characteristics of the conventional thin-film transistor when reliability assessment is performed. FIG. 13B shows the current-voltage characteristics of the thin-film transistor according to this embodiment when reliability assessment is performed.

FIG. 13A and FIG. 13B show the current-voltage characteristics of the respective thin-film transistors measured at 0 seconds, 100 seconds, 200 seconds, 500 seconds, 1000 seconds, and 2000 seconds after negative bias (−20 V) is applied to the gate electrode as stress voltage. FIG. 13A and FIG. 13B also show temporal change in the current-voltage characteristics of the thin-film transistors.

As shown in FIG. 13A, in the thin-film transistor 100 with the altered layer 6a, hump phenomenon slightly appears at the beginning and becomes more notable over time in the initial current-voltage characteristic. On the other hand, as shown in FIG. 13B, in the thin-film transistor 10 with no altered layer 6a and the passivation layer 9 having a major component identical to that of the protective layer 6, no hump phenomenon appears in the beginning nor over time in the current-voltage characteristics.

As described above, the thin-film transistor 10 according to this embodiment is capable of reducing occurrence of hump phenomenon in the current-voltage characteristics. Furthermore, it is also possible to reduce occurrence of hump phenomenon even under application of negatively biased stress voltage to the gate electrode. This leads to high reliability. With this, use of the thin-film transistor 10 according to this embodiment as a driving transistor of the organic EL display improves the characteristics in a low gray scale region (black display region) in a display device.

Figure 14:
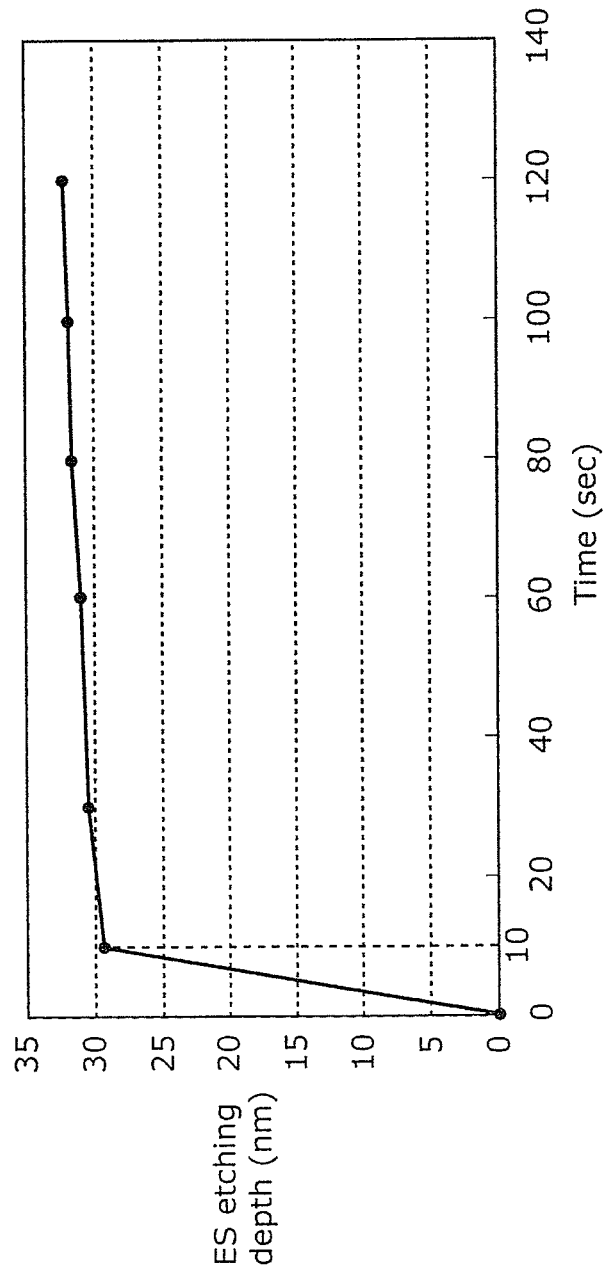
FIG. 14 shows time dependency of the amount of the altered layer removed (amount of etching) by hydrofluoric acid in the thin-film transistor according to the embodiment.

Furthermore, in this embodiment, the altered layer 6a can be removed by dilute hydrofluoric acid. In this case, for example, cleaning is performed over at least 10 seconds using dilute hydrofluoric acid having a concentration of at least 0.5%. This point shall be described with reference to FIG. 14. FIG. 14 shows time dependency of the amount of removal (amount of etching) of the altered layer by hydrofluoric acid in the thin-film transistor according to this embodiment. FIG. 14 shows time dependency of the amount of removal of the altered layer 6a and the protective layer 6 when cleaning is performed using dilute hydrofluoric acid having a concentration of 0.5%.

FIG. 14 shows that the altered layer 6a near the surface of the protective layer 6 is removed in approximately 10 seconds after hydrofluoric acid treatment is performed, and subsequently almost no protective layer 6 is removed. More specifically, it is shown that dilute hydrofluoric acid treatment allows the altered layer 6a to be selectively removed. In addition, it is shown that the etching rate of the altered layer 6a in the hydrofluoric acid treatment is very fast. Hence, it is possible to reliably remove all of the altered layer 6a by performing cleaning over at least 10 seconds using hydrofluoric acid having a concentration of at least 0.5%, independently of the thickness of the protective layer 6. This further reduces occurrence of the parasitic transistor, allowing a thin-film transistor having excellent transistor characteristics.

(Variation 1)

Figure 15:
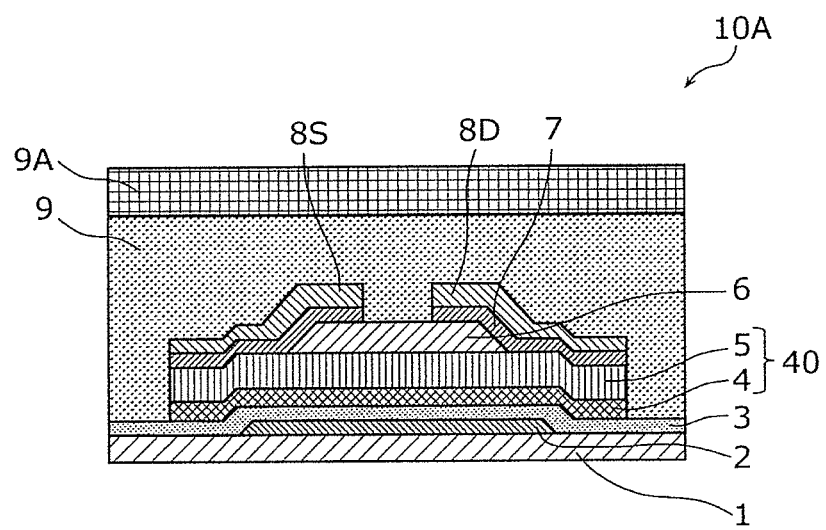
FIG. 15 shows a cross-sectional view of a configuration of a thin-film transistor according to Variation 1 of the embodiment of the present invention.

Next, referring to FIG. 15, a description is given of a thin-film transistor 10A according to Variation 1 of the embodiment of the present invention. FIG. 15 is a cross-sectional view of a configuration of a thin-film transistor according to Variation 1 of the embodiment of the present invention.

As shown in FIG. 15, a thin-film transistor 10A according to Variation 1 includes a sealing layer 9A formed on the passivation layer 9, in addition to the structural elements of the thin-film transistor 10 according to the above embodiment. The sealing layer 9A is a second passivation layer, and comprises a material having an oxygen transmission rate lower than that of the passivation layer 9 serving as the first passivation layer. In Variation 1, the sealing layer 9A includes a stack of films having high sealing capability against water and oxygen. In Variation 1, since the passivation layer 9 comprises silicon oxide, the sealing layer 9A comprises silicon nitride.

Furthermore, compared with the method for manufacturing the thin-film transistor 10 according to the above embodiment, the method for manufacturing the thin-film transistor 10A according to Variation 1 further includes a process of forming the sealing layer 9A so as to cover the passivation layer 9, after the passivation layer formation shown in FIG. 3L.

The passivation layer 9 and the sealing layer 9A can be formed by using a parallel-plate electrode RF plasma CVD apparatus. In this case, for example, a film of silicon oxide having a thickness of 20 nm is formed under a film-forming condition in which the temperature (growth temperature) of the substrate 1 provided in the apparatus is 400 degrees Celsius, the pressure is 3 Torr, an RF power is 180 W, the distance between the parallel-plate electrodes is 550 mm, and gas flow rates of silane and nitrogen monoxide are 20 sccm and 1500 sccm, respectively. Subsequently, a film of silicon nitride having a thickness of 440 nm is continuously formed under a film-forming condition in which the growth temperature is 320 degrees Celsius, the pressure is 3 Torr, an RF power is 150 W, the distance between the parallel-plate electrodes is 550 mm, and gas flow rates of silane, ammonia, and nitrogen are 30 sccm, 100 sccm, and 2000 sccm, respectively.

Figure 16A:
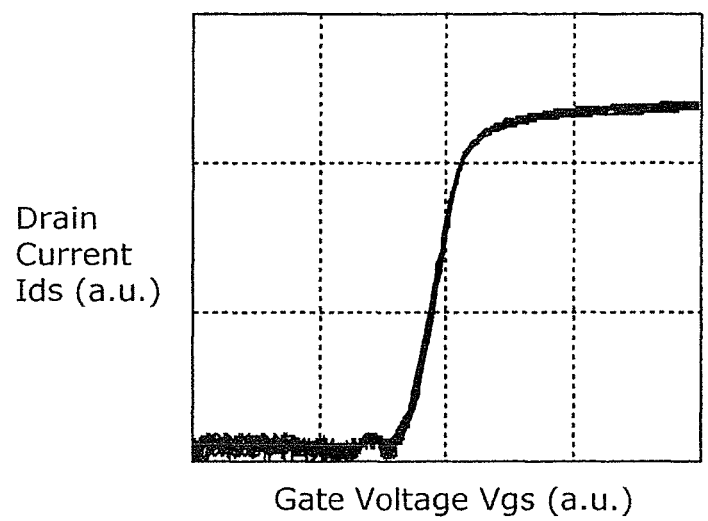
FIG. 16A shows current-voltage characteristics of a thin-film transistor (SiN/SiO=440 nm/20 nm) according to Variation 1 of the embodiment of the present invention.

FIG. 16A shows the current-voltage characteristics of the thus manufactured thin-film transistor according to Variation 1. More specifically, FIG. 16A shows characteristics obtained when, after removing the altered layer 6a, the passivation layer 9 comprising silicon oxide and having a thickness of 20 nm and the sealing layer 9A comprising silicon nitride and having a thickness of 440 nm are continuously formed.

Figure 16B:
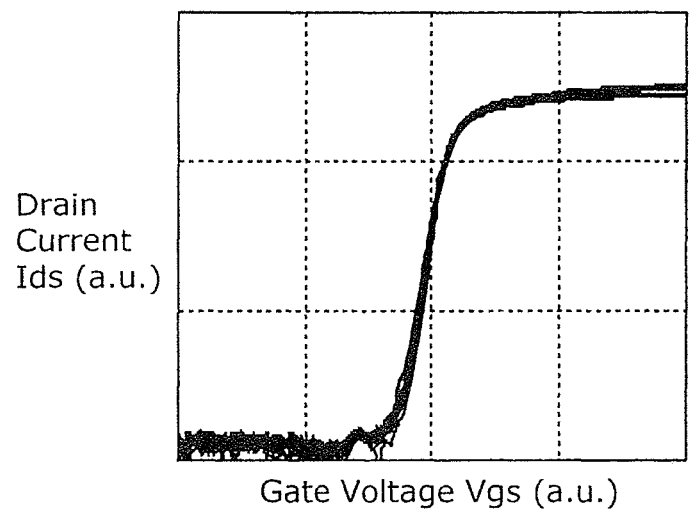
FIG. 16B shows the current-voltage characteristics of a thin-film transistor (SiN/SiO=260 nm/200 nm) according to Variation 1 of the embodiment of the present invention.

FIG. 16B shows the current-voltage characteristics of the thin-film transistor according to Variation 1, and shows characteristics obtained when, after removing the altered layer 6a, the passivation layer 9 comprising silicon oxide and having a thickness of 220 nm and the sealing layer 9A comprising silicon nitride and having a thickness of 260 nm are continuously formed.

As shown in FIG. 16A and FIG. 16B, no hump phenomenon is included in the current-voltage characteristics in both cases. This shows that hump phenomenon can be reduced by forming the passivation layer 9 comprising a material having a major component identical to that of the protective layer 6, at the outer peripheral edge portion of the protective layer 6 in which the altered layer 6a has been removed. Furthermore, it is also shown that hump phenomenon can be sufficiently reduced by forming the passivation layer 9 having a major component identical to that of the protective layer 6 and having a thickness of at least 20 nm. It is also shown that hump phenomenon is not influenced by formation of a sealing layer (second passivation layer) formed of a silicon nitride film or others having a low oxygen transmission rate and high sealing capability, on the passivation layer 9. Stacking two passivation layers in such a manner allows selection of films having different functions such as improvement in film adhesion and improvement in sealing capability, for example. This increases the selection range of materials used for the passivation layer. Furthermore, it is also possible to reduce the thickness of the passivation layer, which is advantageous in reduction in process time and cost.

With the thin-film transistor 10A according to Variation 1, it is possible to reduce entry of water or oxygen from outside into the semiconductor layer 40, by forming, on the passivation layer 9, the sealing layer 9A having a low oxygen transmission rate. Accordingly, it is possible to achieve a reliable thin-film transistor with less variation in transistor characteristics.

Furthermore, under the same total thickness of the passivation layers, it is possible to reduce the thickness of the passivation layer 9 by increasing the thickness of the sealing layer 9A. More specifically, the passivation layer 9 comprising silicon oxide is for reducing occurrence of hump phenomenon by equalizing the amount of fixed charges. The thin-film transistor having the passivation layer 9 comprising silicon oxide is less reliable against water or oxygen than the thin-film transistor having the passivation layer 9 comprising silicon nitride. Hence, in the case where two layers that are the passivation layer 9 and the sealing layer 9A are used for sealing, it is possible both to reduce occurrence of hump phenomenon and entry of water and oxygen, by reducing the thickness of the passivation layer 9 comprising silicon oxide and increasing the sealing layer 9A comprising silicon nitride having a low oxygen transmission rate.

(Variation 2)

Figure 17:
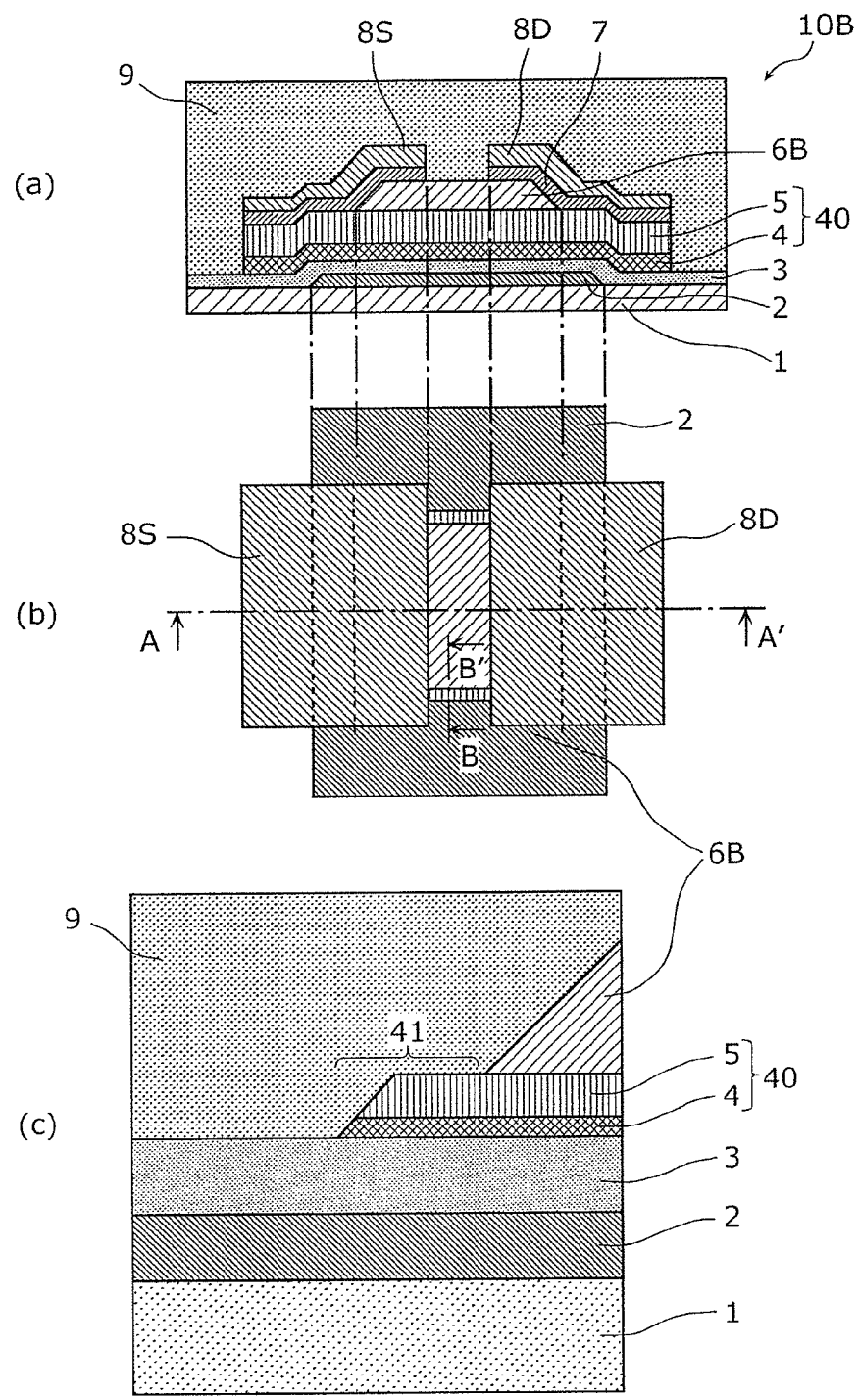
FIG. 17 schematically shows a configuration of a thin-film transistor according to Variation 2 of the embodiment of the present invention.

Next, referring to FIG. 17, a description is given of a thin-film transistor 10B according to Variation 2 of the embodiment of the present invention. FIG. 17 schematically shows a configuration of a thin-film transistor according to Variation 2 of the embodiment of the present invention. In FIG. 17, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

As shown in FIG. 17, the thin-film transistor 10B according to Variation 2 has a protective layer 6B which does not protrude from the source electrode 8S and the drain electrode 8D in the gate width direction. More specifically, in the thin-film transistor 10 according to the embodiment, the protective layer 6 protrudes from the source electrode 8S and the drain electrode 8D. In the thin-film transistor 10B according to Variation 2, the protective layer 6B does not protrude from the source electrode 8S and the drain electrode 8D. The lateral side of the protective layer 6B in the gate width direction recedes from the lateral side of the source electrode 8S and the drain electrode 8D in the gate width direction. The other structural elements are similar to those in the embodiment shown in FIG. 1.

The thin-film transistor 10B according to Variation 2 produces the advantageous effects similar to those of the thin-film transistor 10 according to the above embodiment. Note that the configuration according to Variation 1 can also be applied to Variation 2.

(Others)

Although the thin-film transistor and the method for manufacturing the thin-film transistor according to an aspect of the present invention have been described based on the above embodiment and variations, the present invention is not limited to the embodiment and variations.

For example, although FIG. 4, FIG. 9, and FIG. 11 show positive fixed charges as fixed charges, the fixed charges may be negative fixed charges. Furthermore, the fixed charges may exist either in the bulk of the layer or the interface between the layers. In the present invention, it is important that the amount of fixed charges at the back channel side viewed from the semiconductor layer 40 is equal in the outer peripheral edge portion and the central portion of the protective layer 6.

Furthermore, in the above embodiment, in the process of removing the altered layer 6a, the entire altered layer 6a is removed, however, the present invention is not limited to this. In the process of removing the altered layer 6a, it may be that at least a portion of the region, of the altered layer 6a, which is in contact with the semiconductor layer 40 is removed. By doing so, it is possible to reduce occurrence of the hump phenomenon. On the other hand, removal of a portion, of the altered layer 6a, which is not in contact with the semiconductor layer 40 is considered to make little contribution to reduction in occurrence of the hump phenomenon. Examples of an implementation in which not all of the altered layer 6a is removed include removal of the altered layer 6a so as to reduce the thickness, and removal of only part, of the altered layer 6a, which is in contact with the semiconductor layer 40.

Those skilled in the art will readily appreciate that many modifications and combinations are possible in the exemplary embodiment and variations without materially departing from the novel teachings and advantages of the present invention. Accordingly, all such modifications and combinations are intended to be included within the scope of the present invention.

Figure 18:
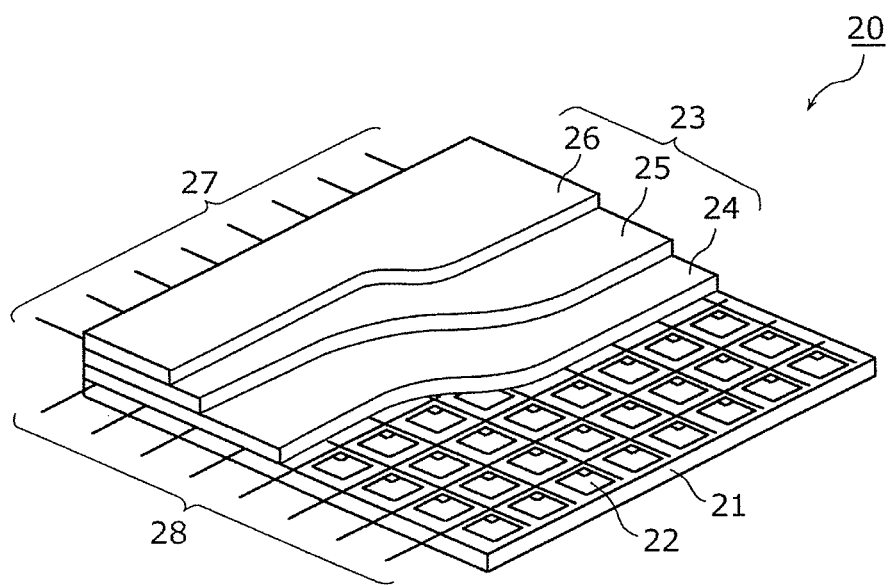
FIG. 18 is a partially cut perspective view of an organic EL display device according to the embodiment of the present invention.

Furthermore, the thin-film transistor according to the embodiment may be used as a display device, such as an organic EL display device, or a liquid crystal display device. For example, referring to FIG. 18, a description is given of an example where the thin-film transistor 10 according to the embodiment is applied to an organic EL display device. FIG. 18 is a partially cut perspective view of an organic EL display device according to the embodiment of the present invention.

As shown in FIG. 18, the organic EL display device 20 according to the embodiment includes: an active matrix substrate 21; a plurality of pixels 22 arranged in a matrix on the active matrix substrate 21; an organic EL device 23 formed corresponding to different one of the pixels 22; a plurality of gate lines 27 formed along a row direction of the pixels 22; a plurality of source lines 28 formed along a column direction of the pixels 22; and power lines 29 (not shown) formed in parallel with the source lines 28. The organic EL device 23 includes an anode 24, an organic EL layer 25, and a cathode 26 (transparent electrode) that are sequentially stacked on the active matrix substrate 21. The organic EL layer 25 includes a stack of an electron transport layer, an emission layer, a hole transport layer, and so on.

Although the thin-film transistor 10 according to the embodiment is provided as a switching transistor for selecting one of the pixels 22, but may also be used as a driving transistor.

Figure 19:
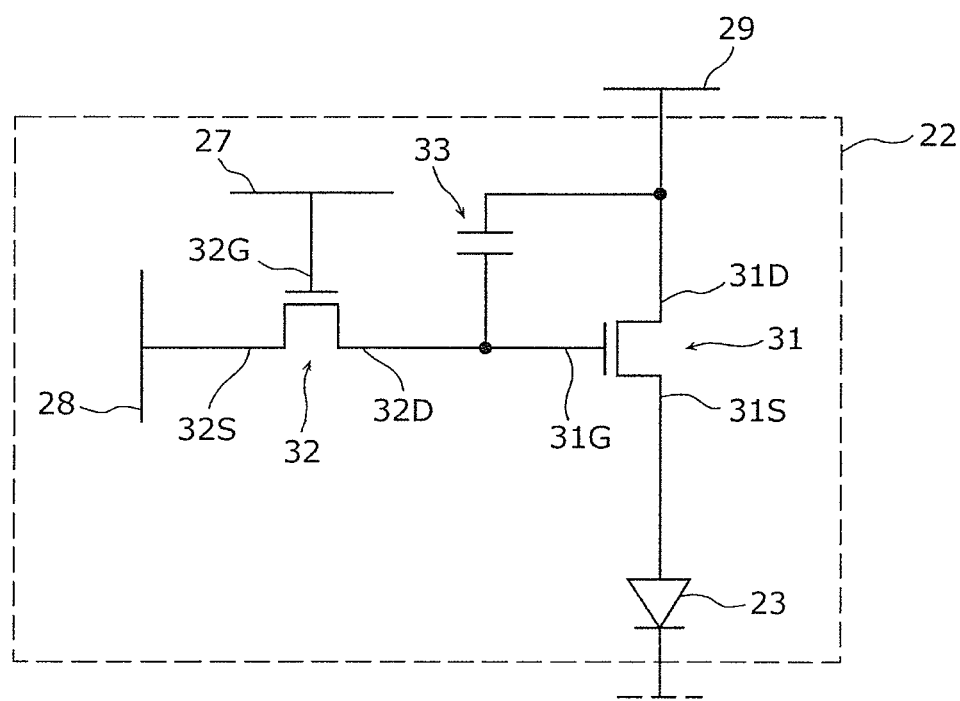
FIG. 19 shows a circuit configuration of a pixel which includes the thin-film transistor according to the embodiment of the present invention.

Next, referring to FIG. 19, a description is given of a circuit configuration of the pixel 22 in the organic EL display device 20. FIG. 19 shows a circuit configuration of a pixel which includes the thin-film transistor according to the embodiment of the present invention.

As shown in FIG. 19, each pixel 22 is partitioned by the gate line 27 and the source line 28 that are orthogonal to each other, and includes a driving transistor 31, a switching transistor 32, the organic EL device 23, and a capacitor 33. The driving transistor 31 is a transistor that drives the organic EL device 23. The switching transistor 32 is a transistor that selects the pixel 22.

In the driving transistor 31, a gate electrode 31G is connected to a drain electrode 32D of the switching transistor 32, a source electrode 31S is connected to the anode of the organic EL device 23 via a relay electrode (not shown), and a drain electrode 31D is connected to the power line 29.

In addition, in the switching transistor 32, the gate electrode 32G is connected to the gate 27, the source electrode 32S is connected to the source line 28, and the drain electrode 32D is connected to the capacitor 33 and the gate electrode 31G of the driving transistor 31.

In this configuration, when a gate signal is input into the gate line 27 to turn on the switching transistor 32, the video signal voltage supplied via the source line 28 is written into the capacitor 33. The video signal voltage written into the capacitor 33 is held for a period of one frame. The held video signal voltage causes analog change in conductance of the driving transistor 31 and causes the driving current corresponding to luminescence gradation to flow from the anode to the cathode of the organic EL device 23. This causes the organic EL device to emit light. As a result, a predetermined image is displayed.

In addition, the display device such as the organic EL display device according to this embodiment can be used as a flat-panel display, and is applicable to electronic devices such as television sets, personal computers, or mobile phones.

INDUSTRIAL APPLICABILITY

The thin-film transistor according to an aspect of the present invention is widely applicable to display devices such as television sets, personal computers, and mobile phones, or various electronic devices having thin-film transistors.

REFERENCE SIGNS LIST

1 Substrate
2, 31G, 32G, Gate electrode
3 Gate insulating layer
4 Crystalline silicon semiconductor layer
4F Crystalline silicon semiconductor film
5 Amorphous silicon semiconductor layer
5F Amorphous silicon semiconductor film
6, 6B Protective layer
6a Altered layer
7 Contact layer
7F Contact layer film
8S, 31S, 32S Source electrode
8D, 31D, 32D Drain electrode
8F Source-drain metal film
9, 900 Passivation layer
9A Sealing layer
10, 10A, 10B, 100, 100A Thin-film transistor
20 Organic EL display device
21 Active matrix substrate
22 Pixel
23 Organic EL device
24 Anode
25 Organic EL layer
26 Cathode
27 Gate line 28 Source line
29 Power line
31 Driving transistor
32 Switching transistor
33 Capacitor
40 Semiconductor layer
40F Semiconductor film
41 Protruding portion

The invention claimed is:

1. A method for manufacturing a thin-film transistor, the method comprising:
    preparing a substrate;
    forming a gate electrode above the substrate;
    forming a gate insulating layer above the gate electrode;
    forming a semiconductor film above the gate insulating layer;
    forming, above the semiconductor film, an etch-stopper layer comprising an organic material;
    forming a source electrode and a drain electrode that are opposed to each other, each of the source electrode and the drain electrode having at least a portion located above the etch-stopper layer;
    forming a semiconductor layer patterned, by performing dry etching on the semiconductor film;
    removing at least a portion of a region of an altered layer, the region contacting the semiconductor layer, the altered layer being a surface layer of the etch-stopper layer that is (i) exposed from the source electrode and the drain electrode and (ii) altered by the dry etching; and
    forming a passivation layer so as to contact the semiconductor layer in a region in which the altered layer has been removed, the passivation layer having a major component identical to a major component of the etch-stopper layer.

2. The method for manufacturing the thin-film transistor according to claim 1,
    wherein the altered layer has a density higher than a density of a portion of the etch-stopper layer which is not altered by the dry etching.

3. The method for manufacturing the thin-film transistor according to claim 1,
    wherein the altered layer has a thickness of at least 30 nm.

4. The method for manufacturing the thin-film transistor according to claim 1,
    wherein the altered layer has a chlorine concentration which is at least ten times higher than a chlorine concentration of the etch-stopper layer.

5. The method for manufacturing the thin-film transistor according to claim 1,
    wherein the altered layer has a carbon concentration which is at most one hundredth of a carbon concentration of the etch-stopper layer.

6. The method for manufacturing the thin-film transistor according to claim 1,
    wherein in the removing, the altered layer is removed by dilute hydrofluoric acid.

7. The method for manufacturing the thin-film transistor according to claim 6,
    wherein the dilute hydrofluoric acid has a concentration of at least 0.5%, and
    in the removing, the altered layer is removed by performing cleaning using the dilute hydrofluoric acid over at least ten seconds.

8. The method for manufacturing the thin-film transistor according to claim 1,
    wherein the passivation layer comprises a material identical to a material of the etch-stopper layer.

9. The method for manufacturing the thin-film transistor according to claim 1,
    wherein the passivation layer comprises an inorganic material.

10. The method for manufacturing the thin-film transistor according to claim 9,
    wherein the etch-stopper layer comprises silicon as a major component, and
    the passivation layer comprises oxide silicon.

11. The method for manufacturing the thin-film transistor according to claim 1,
    wherein the passivation layer has a thickness of at least 20 nm and at most 1000 nm.

12. The method for manufacturing the thin-film transistor according claim 1, further comprising
    forming, above the passivation layer, a sealing layer comprising a material having an oxygen transmission rate lower than an oxygen transmission rate of the passivation layer.

13. The method for manufacturing the thin-film transistor according to claim 12,
    wherein the sealing layer comprises silicon nitride.

14. A thin-film transistor comprising:
    a gate electrode above a substrate;
    a gate insulating layer above the gate electrode;
    a semiconductor layer that is opposed to the gate electrode with the gate insulating layer therebetween;
    an etch-stopper layer above the semiconductor layer and comprising an organic material;
    a source electrode and a drain electrode that are opposed to each other, each of the source electrode and the drain electrode having at least a portion located above the etch-stopper layer; and
    a passivation layer above the etch-stopper layer,
    wherein the etch-stopper layer has a surface portion and a portion located further inward than the surface portion which are uniform in composition, and
    the passivation layer covers a border between (i) a surface of the etch-stopper layer and (ii) the semiconductor layer, and an outer peripheral region that is a surface of the semiconductor layer and located further outward than the border relative to a region where the etch-stopper layer is located, the passivation layer contacting the border and the outer peripheral region and having a major component identical to a major component of the etch-stopper layer.

15. The thin-film transistor according to claim 14,
    wherein the etch-stopper layer has a uniform composition throughout.

16. The thin-film transistor according to claim 14,
    wherein the semiconductor layer includes a protruding portion protruding from the etch-stopper layer in a gate width direction, and
    the protruding portion has an upper surface covered with the passivation layer.

17. The thin-film transistor according to claim 14,
    wherein the passivation layer comprises an inorganic material.

18. The thin-film transistor according to claim 17,
    wherein the etch-stopper layer comprises silicon as a major component, and
    the passivation layer comprises silicon oxide.

19. The thin-film transistor according to claim 14,
    wherein the passivation layer has a thickness of at least 20 nm and at most 1000 nm.

20. The thin-film transistor according to claim 14, further comprises
   a sealing layer above the passivation layer and comprising a material having an oxygen transmission rate lower than an oxygen transmission rate of the passivation layer.

21. The thin-film transistor according to claim 20, wherein the sealing layer comprises silicon nitride.

* * * * *